US009728510B2

(12) United States Patent
Xue et al.

(10) Patent No.: US 9,728,510 B2
(45) Date of Patent: Aug. 8, 2017

(54) CAVITY PACKAGE WITH COMPOSITE SUBSTRATE

(71) Applicant: ANALOG DEVICES, INC., Norwood, MA (US)

(72) Inventors: Xiaojie Xue, Bedford, MA (US); Dipak Sengupta, Boxborough, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/952,562

(22) Filed: Nov. 25, 2015

(65) Prior Publication Data

US 2016/0300781 A1   Oct. 13, 2016

Related U.S. Application Data

(60) Provisional application No. 62/145,713, filed on Apr. 10, 2015.

(51) Int. Cl.
*H01L 23/552* (2006.01)
*H01L 23/043* (2006.01)
(Continued)

(52) U.S. Cl.
CPC .......... *H01L 23/552* (2013.01); *H01L 23/043* (2013.01); *H01L 23/49503* (2013.01);
(Continued)

(58) Field of Classification Search
CPC ............. H01L 23/49506; H01L 23/043; H01L 23/552; H01L 2924/1632;
(Continued)

(56) References Cited

U.S. PATENT DOCUMENTS

| 5,194,695 A | 3/1993 | Maslakow |
| 5,223,747 A | 6/1993 | Tschulena |
| 5,447,601 A | 9/1995 | Norris |
| 5,482,898 A | 1/1996 | Marrs |
| 5,483,740 A | 1/1996 | Maslakow |

(Continued)

FOREIGN PATENT DOCUMENTS

| CN | 102275859 | 12/2011 |
| JP | 09-134994 | 5/1997 |

(Continued)

OTHER PUBLICATIONS

International Search Report and Written Opinion received in International Patent Application No. PCT/US2012/058769, dated Feb. 15, 2013, filed on Oct. 4, 2012; in 16 pages.

*Primary Examiner* — Yasser A Abdelaziez
(74) *Attorney, Agent, or Firm* — Knobbe, Martens, Olson & Bear LLP

(57) ABSTRACT

An integrated device package is disclosed. The package can include a package substrate comprising a composite die pad having an upper surface and a lower surface spaced from the upper surface along a vertical direction. The composite die pad can include an insulator die pad and a metal die pad. The insulator die pad and the metal die pad can be disposed adjacent one another along the vertical direction. The substrate can include a plurality of leads disposed about at least a portion of a perimeter of the composite die pad. An integrated device die can be mounted on the upper surface of the composite die pad.

20 Claims, 15 Drawing Sheets

(51) Int. Cl.
*H01L 23/495* (2006.01)
*H01L 23/498* (2006.01)
*H01L 23/00* (2006.01)

(52) U.S. Cl.
CPC .. *H01L 23/49541* (2013.01); *H01L 23/49861* (2013.01); *H01L 23/562* (2013.01); *H01L 24/16* (2013.01); *H01L 24/32* (2013.01); *H01L 24/48* (2013.01); *H01L 24/73* (2013.01); *H01L 2224/16145* (2013.01); *H01L 2224/32225* (2013.01); *H01L 2224/48247* (2013.01); *H01L 2224/73207* (2013.01); *H01L 2224/73265* (2013.01); *H01L 2924/00014* (2013.01); *H01L 2924/1433* (2013.01); *H01L 2924/1461* (2013.01); *H01L 2924/15159* (2013.01); *H01L 2924/1632* (2013.01); *H01L 2924/16251* (2013.01); *H01L 2924/16315* (2013.01); *H01L 2924/181* (2013.01)

(58) Field of Classification Search
CPC . H01L 2924/16315; H01L 2924/16251; H01L 23/562; H01L 24/16; H01L 24/32; H01L 24/48; H01L 24/73; H01L 2224/16145; H01L 2224/32225; H01L 2224/48247; H01L 2224/0012
See application file for complete search history.

(56) References Cited

U.S. PATENT DOCUMENTS

| | | |
|---|---|---|
| 5,656,776 A | 8/1997 | Otani |
| 5,773,878 A | 6/1998 | Lim et al. |
| 5,804,468 A | 9/1998 | Tsuji et al. |
| 6,034,429 A | 3/2000 | Glenn et al. |
| 6,117,705 A | 9/2000 | Glenn et al. |
| 6,124,630 A | 9/2000 | Stave |
| 6,201,302 B1 | 3/2001 | Tzu |
| 6,214,644 B1 | 4/2001 | Glenn |
| 6,331,452 B1 | 12/2001 | Gall |
| 6,342,406 B1 | 1/2002 | Glenn et al. |
| 6,389,687 B1 | 5/2002 | Glenn et al. |
| 6,396,043 B1 | 5/2002 | Glenn et al. |
| 6,407,381 B1 | 6/2002 | Glenn et al. |
| 6,415,505 B1 | 7/2002 | Glenn |
| 6,420,201 B1 | 7/2002 | Webster |
| 6,420,204 B2 | 7/2002 | Glenn |
| 6,432,737 B1 | 8/2002 | Webster |
| 6,448,506 B1 | 9/2002 | Glenn et al. |
| 6,476,478 B1 | 11/2002 | Swiss et al. |
| 6,483,101 B1 | 11/2002 | Webster |
| 6,492,699 B1 | 12/2002 | Glenn et al. |
| 6,518,659 B1 | 2/2003 | Glenn |
| 6,522,015 B1 | 2/2003 | Glenn et al. |
| 6,528,869 B1 | 3/2003 | Glenn et al. |
| 6,528,875 B1 | 3/2003 | Glenn et al. |
| 6,532,157 B1 | 3/2003 | Glenn et al. |
| 6,562,655 B1 | 5/2003 | Glenn et al. |
| 6,564,454 B1 | 5/2003 | Glenn et al. |
| 6,600,217 B2 | 7/2003 | Onodera et al. |
| 6,627,987 B1 | 9/2003 | Glenn et al. |
| 6,630,661 B1 | 10/2003 | Hoffman |
| 6,661,083 B2 | 12/2003 | Lee et al. |
| 6,686,580 B1 | 2/2004 | Glenn et al. |
| 6,717,126 B1 | 4/2004 | Glenn et al. |
| 6,816,523 B1 | 11/2004 | Glenn et al. |
| 6,838,309 B1 | 1/2005 | McCann |
| 6,849,916 B1 | 2/2005 | Glenn et al. |
| 6,888,231 B2 | 5/2005 | Maeda |
| 6,919,631 B1 | 7/2005 | Hoffman et al. |
| 6,946,728 B2 | 9/2005 | Chen et al. |
| 6,963,141 B2 | 11/2005 | Lee et al. |
| 6,967,395 B1 | 11/2005 | Glenn et al. |
| 7,135,760 B2 | 11/2006 | Han et al. |
| 7,227,236 B1 | 6/2007 | Lee et al. |
| 7,321,162 B1 | 1/2008 | Lee et al. |
| 7,332,712 B2 | 2/2008 | Webster |
| 7,414,318 B2 | 8/2008 | Shim et al. |
| 7,550,828 B2 | 6/2009 | Ramakrishna et al. |
| 7,572,681 B1 | 8/2009 | Huemoeller et al. |
| 7,576,401 B1 | 8/2009 | de Guzman et al. |
| 7,609,461 B1 | 10/2009 | Webster et al. |
| 7,692,288 B2 | 4/2010 | Zhe et al. |
| 7,781,852 B1 | 8/2010 | Faheem et al. |
| 7,795,078 B2 | 9/2010 | Ramakrishna et al. |
| 7,821,554 B2 | 10/2010 | Ma et al. |
| 7,838,974 B2 | 11/2010 | Poddar et al. |
| 7,842,541 B1 | 11/2010 | Rusli et al. |
| 7,911,017 B1 | 3/2011 | de Guzman et al. |
| 7,923,791 B2 | 4/2011 | Huang et al. |
| 7,936,033 B2 | 5/2011 | Haskett et al. |
| 7,977,163 B1 | 7/2011 | Huemoeller et al. |
| 7,993,980 B2 | 8/2011 | Fukuda et al. |
| 8,017,445 B1 | 9/2011 | Chang et al. |
| 8,115,283 B1 | 2/2012 | Bolognia et al. |
| 8,138,586 B2 | 3/2012 | Trasporto et al. |
| 8,230,743 B2 | 7/2012 | Wade et al. |
| 8,354,747 B1 | 1/2013 | Kuo |
| 8,358,005 B2 | 1/2013 | Kizilyalli et al. |
| 8,445,984 B2 | 5/2013 | Haskett et al. |
| 8,525,307 B2 | 9/2013 | Ito et al. |
| 8,618,619 B1 | 12/2013 | Miks et al. |
| 8,633,575 B1 | 1/2014 | Mangrum |
| 8,786,075 B1 | 7/2014 | Miks et al. |
| 8,921,955 B1 | 12/2014 | Lee et al. |
| 9,013,034 B2 | 4/2015 | Takagi |
| 9,337,095 B2 | 5/2016 | Li |
| 9,496,204 B2 | 11/2016 | Hasebe et al. |
| 2002/0021874 A1 | 2/2002 | Giboney et al. |
| 2004/0070056 A1 | 4/2004 | Matsuzawa et al. |
| 2005/0051859 A1 | 3/2005 | Hoffman |
| 2005/0122100 A1 | 6/2005 | Wan et al. |
| 2006/0081969 A1 | 4/2006 | Ku |
| 2006/0289973 A1 | 12/2006 | Lee |
| 2007/0202627 A1 | 8/2007 | Minervini |
| 2008/0012085 A1 | 1/2008 | Cheng et al. |
| 2008/0079142 A1 | 4/2008 | Carmona et al. |
| 2008/0157301 A1 | 7/2008 | Ramakrishna et al. |
| 2009/0026597 A1 | 1/2009 | Yim |
| 2009/0116669 A1 | 5/2009 | Song |
| 2009/0179233 A1 | 7/2009 | Lee et al. |
| 2009/0213262 A1 | 8/2009 | Singh et al. |
| 2009/0243058 A1 | 10/2009 | Shirasaka |
| 2009/0243060 A1 | 10/2009 | Saitoh |
| 2010/0090295 A1 | 4/2010 | Zhe et al. |
| 2011/0053321 A1 | 3/2011 | Huang |
| 2011/0156106 A1 | 6/2011 | Lee et al. |
| 2011/0198714 A1 | 8/2011 | Yang |
| 2012/0074544 A1 | 3/2012 | Masuda et al. |
| 2012/0093346 A1* | 4/2012 | Feiertag ............... H04R 1/2884 381/174 |
| 2012/0104629 A1 | 5/2012 | Bolognia et al. |
| 2012/0119341 A1 | 5/2012 | Warren et al. |
| 2012/0270354 A1 | 10/2012 | Hooper et al. |
| 2013/0032905 A1* | 2/2013 | Lo ............... B81B 7/007 257/416 |
| 2013/0075922 A1 | 3/2013 | Huang et al. |
| 2013/0154066 A1 | 6/2013 | Kim et al. |
| 2013/0214402 A1 | 8/2013 | Park et al. |
| 2014/0017843 A1 | 1/2014 | Jung et al. |
| 2014/0042605 A1 | 2/2014 | Lee et al. |
| 2014/0131848 A1 | 5/2014 | Lee et al. |
| 2014/0217566 A1* | 8/2014 | Goida ............... H01L 23/04 257/676 |

FOREIGN PATENT DOCUMENTS

| | | |
|---|---|---|
| JP | 2013-062491 | 4/2013 |
| JP | 2014-60371 | 4/2014 |
| KR | 10-2010-0028794 | 3/2010 |

\* cited by examiner

CAVITY PACKAGE WITH COMPOSITE SUBSTRATE

CROSS-REFERENCE TO RELATED APPLICATIONS

This application claims priority to U.S. Provisional Patent Application No. 62/145,713, filed on Apr. 10, 2015, the entire contents of which are incorporated by reference herein in their entirety and for all purposes.

BACKGROUND

Field

The field relates generally to cavity packages with a composite substrate.

Description of the Related Art

In various types of integrated devices, it can be challenging to package stress-sensitive components for integration into the larger electronic system. For example, microelectromechanical systems (MEMS) devices, such as accelerometers, gyroscopes, etc., may include moveable components that are sensitive to stresses from molding material or encapsulant. Circuits with absolute output requirements (e.g., voltage reference circuits) may also have similar sensitivity to packaging stresses. Furthermore, external loads to the package substrate can cause numerous problems such as inaccurate calibration. Accordingly, there remains a continuing need for improved packaging techniques.

SUMMARY

In one embodiment, an integrated device package is disclosed. The package can comprise a package substrate. The package substrate can comprise an insulator die pad comprising an insulating material and a plurality of leads disposed about at least a portion of a perimeter of the insulator die pad. The package can include an integrated device die mounted over the insulator die pad. The package can include a package lid mounted to the package substrate to define a cavity, the integrated device die disposed within the cavity.

In another embodiment, an integrated device package is disclosed. The package can comprise a package substrate comprising a molded leadframe in which a metal leadframe is at least partially embedded in a molding material. The package substrate can comprise an annular metal ring, a die pad disposed inside the annular metal ring, and a plurality of leads disposed about at least a portion of a perimeter of the die pad. The package can include an integrated device die mounted to the die pad on an upper surface of the package substrate.

In yet another embodiment, a method of manufacturing an integrated device package is disclosed. The method can comprise providing a package substrate comprising an insulator die pad comprising an insulating material and a plurality of leads disposed about at least a portion of a perimeter of the insulator die pad. The method can comprise mounting an integrated device die over the insulator die pad. The method can comprise mounting a package lid to the package substrate to define a cavity such that the integrated device die is disposed within the cavity.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Specific implementations of the invention will now be described with reference to the following drawings, which are provided by way of example, and not limitation.

DETAILED DESCRIPTION

Figure 1A:
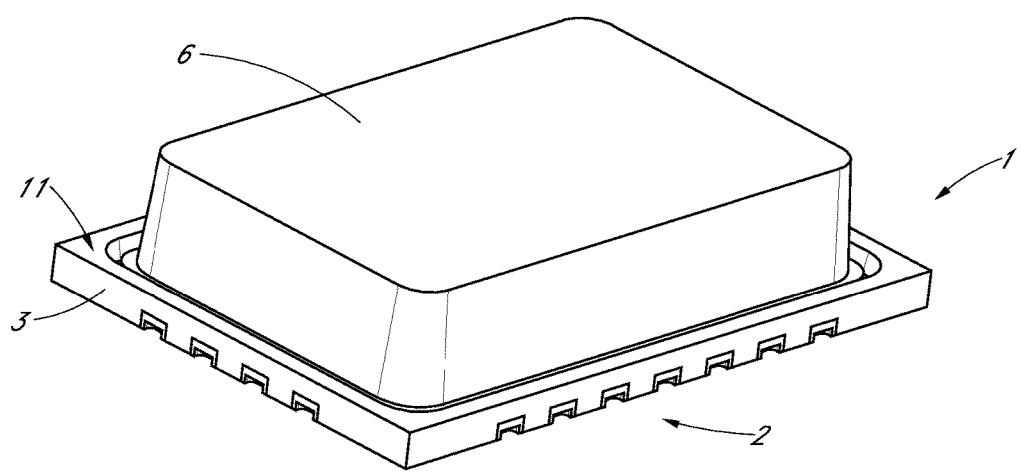
FIG. 1A is a schematic top, left and front perspective view of an integrated device package, according to one embodiment.

In various embodiments disclosed herein, integrated device dies can be packaged in a device package, such as a leadframe chip scale package (LFCSP). For example, microelectromechanical systems (MEMS) dies (e.g., gyroscopes, accelerometers, etc.) can be mounted to a package substrate, such as a leadframe. The package substrate can comprise a molded leadframe, e.g., a metal leadframe which is pre-molded or embedded in a plastic molding material. The use of molded leadframes as the package substrate in LFCSP packages can advantageously reduce manufacturing or packaging costs as compared with small outline integrated circuit (SOIC) cavity packages, and can facilitate use of a lid to create cavity packages for devices that are too sensitive to subject to overmolding. Furthermore, LFCSP packages may exhibit improved reliability when compared with printed circuit board (PCB) based land grid array (LGA) cavity packages.

In various embodiments disclosed herein, a package lid can be mounted to the package substrate over the die(s) to form a cavity in which the device die(s) are positioned. Advantageously, the use of a cavity package can reduce the amount of external stresses imposed on the device die(s), as compared with other packages, such as overmolded or encapsulated packages. For example, in motion sensor packages, the device dies (such as a MEMS die) may comprise one or more movable components which vibrate or otherwise move in response to an external force or acceleration. Disposing the device dies within an air cavity can advantageously isolate the movable components from other portions of the package or system which may otherwise induce stresses on the moving components. Similarly, reference voltage circuits and other circuits with absolute output needs may benefit from cavity packages as opposed to overmold encapsulation.

In some arrangements, the use of a leadframe may result in a package with a relatively low stiffness, which may be vulnerable to external loading conditions and which may cause inaccurate calibration. For example, conventional metal leadframes may be relatively thin (e.g., less than or about 12 millimeters thick), which can reduce the overall stiffness of the package. Packages which incorporate relatively thin leadframes, and which therefore have relatively low stiffnesses, may be more susceptible to external loads or stresses. Furthermore, packages incorporating relatively thin leadframes may have low resonant frequencies, which may increase the risk of failure or calibration errors. Accordingly, there remains a continuing need for a leadframe-based package in which the package substrate has a sufficiently high stiffness and/or thickness to minimize transmission of stresses to the die(s).

In various embodiments disclosed herein, the package substrate can comprise a molded leadframe in which a metal leadframe is at least partially embedded in a molding material. The integrated device die can be mounted and adhered to a composite die pad which includes both a metal (e.g., the metal leadframe material) and an insulating material (e.g., the molding material in which the metal leadframe is embedded). The insulating material may be a plastic or ceramic molded material, for example. In some embodiments, the molding material may comprise a filler material (e.g., a conductive filler), for example to increase thermal conductivity without shorting the leads. The composite die pad can have an upper surface and a lower surface spaced from the upper surface along a vertical direction. The composite die pad can comprise an insulator die pad and a metal die pad. The insulator die pad and the metal die pad can be disposed adjacent one another along the vertical direction, such that the metal die pad can be above, below or embedded within the insulator die pad. A plurality of leads can be disposed about at least a portion of a perimeter of the composite die pad. The leads can be embedded within the molding material while exposed at the bottom and/or outer edge, and electrically separated from each other and from the composite die pad by the molding material.

Advantageously, the thickness of the insulator die pad (e.g., which may comprise the molding material) may be selected to achieve a desired substrate stiffness. In some embodiments, the insulator die pad may be selected to be sufficiently thick such that the stresses transmitted from the substrate to the integrated device die do not impair the functionality of the device die. Furthermore, the resonant frequency of the package may be adjusted by selecting a corresponding thickness of the insulator die pad. Accordingly, even in situations in which the thickness of the metal die pad (which may correspond to the metal leadframe) is fixed or predetermined by the metal leadframe supplier or manufacturer, the thickness of the insulator die pad can be varied to adjust the package stiffness and/or resonant frequency, without necessarily adjusting the thickness of the leads. Thus, in some illustrated embodiments, the composite die pad is thicker than the metal leads.

Figure 1B:
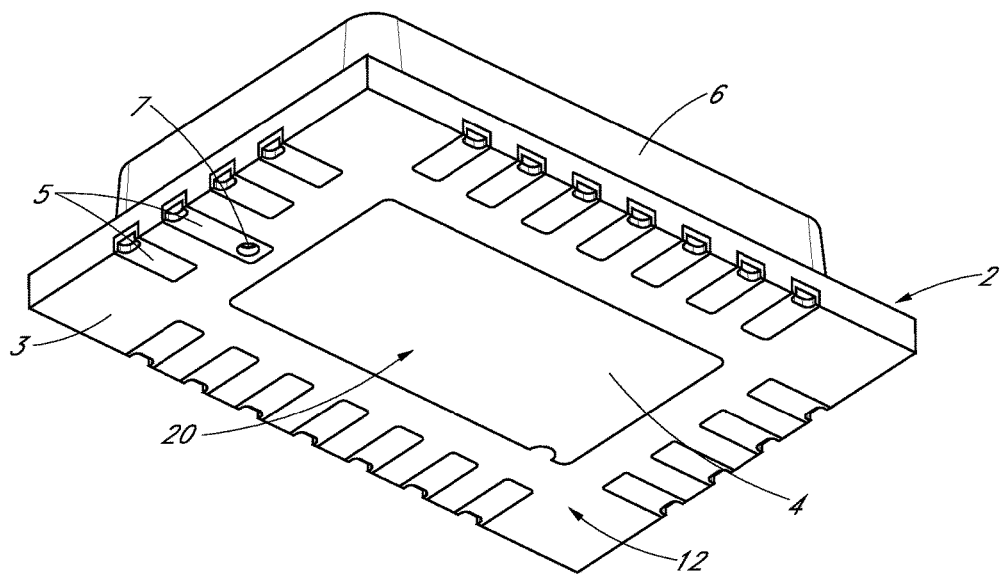
FIG. 1B is a schematic bottom, left and front perspective view of the package shown in FIG. 1A.

FIG. 1A is a schematic, top perspective view of an integrated device package 1, according to one embodiment. FIG. 1B is a schematic, bottom perspective view of the package 1 shown in FIG. 1A. As shown in FIGS. 1A-1B, the package 1 can comprise a package substrate 2 and a lid 6 mounted to an upper surface 11 of the package substrate 2. The lid 6 can comprise a shaped metal lid or a shaped plastic lid, and can be coated with a metal. As explained in more detail below with respect to FIG. 1E, the lid 6 can be shaped to define a cavity when mounted to the substrate 2. In other embodiments (not shown), the package substrate can have walls that cooperate with a planar lid to define a cavity. In some embodiments, the lid 6 can be electrically grounded to form a radio frequency (RF) shield for shielding the components of the package from electromagnetic radiation. For example, the lid 6 can be mounted to the upper surface 11 of the substrate 6 by a conductive epoxy to provide an electrical connection between the lid 6 and an electrical ground lead. A vent hole 7 can be defined through a lower surface 12 of the package substrate 2 (e.g., through a lead of the substrate 2) to permit air to escape from within the package 1 when the lid 6 is attached to the substrate 2 and/or when the package is mounted to a larger electronic device (e.g., system board). The vent hole 7 can be optionally plugged after lid mounting and/or during mounting to the system board. Some of the features labeled in FIGS. 1A-1B are described below with respect to FIGS. 1C-1D.

Figure 1C:
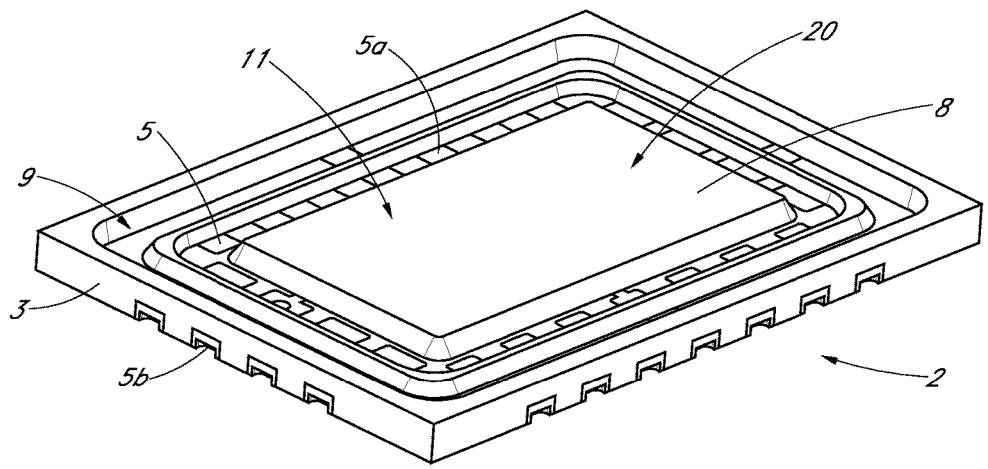
FIG. 1C is a schematic top, left and front perspective view of the package substrate used in the package of FIGS. 1A-1B.
Figure 1D:
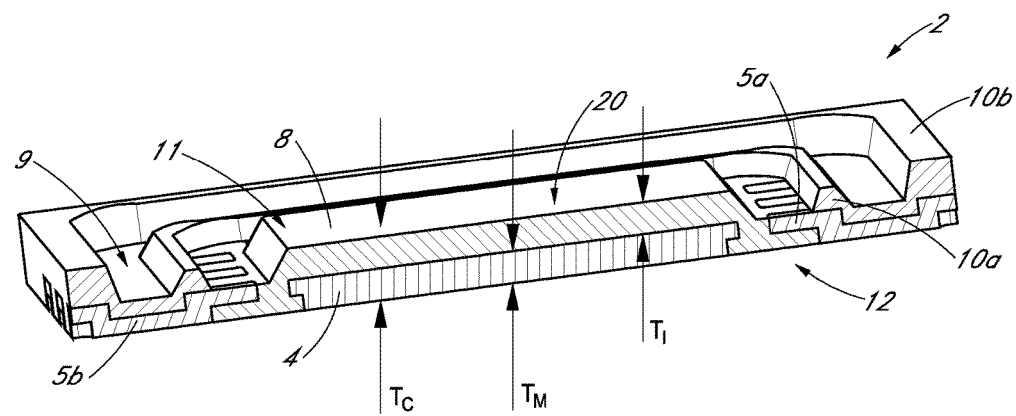
FIG. 1D is a schematic top and front perspective sectioned view of the package substrate of FIG. 1C.

FIG. 1C is a schematic, top perspective view of the package substrate 2 used in the package 1 of FIGS. 1A-1B. FIG. 1D is a schematic, perspective side cross-sectional view of the package substrate 2 of FIG. 1C. The package substrate 2 shown in FIGS. 1A-1D can comprise a molded leadframe substrate which includes a metallic leadframe embedded or pre-molded in a plastic molding material 3. The metallic leadframe can include a metal die pad 4 and a plurality of leads 5. The molding material 3 can be molded about at least portions of the metal die pad 4 and leads 5. As shown in FIGS. 1B-1D, the package substrate 2 can comprise a composite die pad 20, and the plurality of electrical leads 5 can disposed at least partially about a perimeter of the composite die pad 20. The leads 5 can be exposed at the lower surface 12 and/or side edges of the package substrate 2 and can be configured to electrically connect to a system board, such as a printed circuit board (PCB), by way of suitable electrical connections (e.g., solder). The metallic leadframe may comprise any suitable conductor, such as copper or alloy 42. The molding material 3 may comprise any suitable polymer, such as epoxy molding compounds or liquid crystal polymer (LCP). In various embodiments, the package lid 6 can comprise a metal (e.g., copper or stainless steel) or a plastic coated with metal (e.g., LCP or polyphenylene sulfide, PPS).

As shown in FIGS. 1B-1D, the composite die pad 20 can comprise the metal die pad 4 and an insulator die pad 8. The insulator die pad 8 can comprise a portion of the molding material 3, and the metal die pad 4 can comprise a portion of the metal leadframe. The insulator die pad 8 can be disposed vertically adjacent to the metal die pad 4. In the embodiment of FIGS. 1A-1D, the insulator die pad 8 can be disposed on top of the metal die pad 4 such that the insulator die pad 8 is exposed at and partially defines the upper surface 11 of the package substrate 2 (or the composite die pad 20) and the metal die pad 4 is exposed at (or at least partially defines) the lower surface 12 of the package substrate 2 (or the composite die pad 20). However, in other embodiments, it may be suitable to dispose the metal die pad 4 on top of the insulator die pad 8 such that the metal die pad 4 is exposed at and partially defines the upper surface 11 of the package substrate 2 (or the composite die pad 20) and the insulator die pad 8 is exposed at (or at least partially defines) the lower surface 12 of the package substrate 2 (or the composite die pad 20). In still other arrangements, the die pad 20 can comprise only the molding material (or insulator die pad) (see, e.g., FIG. 1F).

The composite die pad 20 can be selected to have a thickness which provides the package 1 with a stiffness sufficient to accommodate external loads and vibrations which may be experienced during operation of the larger electronic system. For example, in conventional leadframe packages, the leadframe may have a predetermined thickness (e.g., less than or about 12 millimeters), which may limit the ability to design a package with adequate stiffness for certain types of dies, such as accelerometers and gyroscopes. In the embodiments disclosed herein, the thickness of the molding material 3 (and hence the insulator die pad 8) can be tailored to provide a desired stiffness and/or resonant frequency for the package 1. Thus, in the disclosed embodiments, the package stiffness and/or resonant frequency can be selected by choosing a corresponding thickness of the insulator die pad 8, even in situations in which the thickness of the metal die pad 4 is fixed or pre-determined by a third party such as the leadframe supplier or manufacturer.

For example, in various embodiments, a thickness $T_C$ of the composite die pad 20 can be in a range of 50 microns to 2 mm, in a range of 50 microns to 1.5 mm, or more particularly, in a range of 50 microns to 1 mm. In some arrangements, a thickness of $T_M$ of the metal die pad 4 can be in a range of 50 microns to 500 microns, in a range of 75 microns to 350 microns, or more particularly, in a range of 100 microns to 300 microns. An overall or total thickness $T_I$ of the insulator die pad 8 can be less than 2 mm, less than 1.95 mm, less than 1.5 mm, less than 1.45 mm, less than 1.2 mm. The overall or total thickness $T_I$ of the insulator die pad 8 can be in a range of 50 microns to 2 mm, or in a range of 50 microns to 1.5 mm.

Furthermore, as shown in FIGS. 1C-1D, the leads 5 can comprise an inner lead portion 5a and an outer lead portion 5b. The inner lead portion 5a can extend inwardly toward the composite die pad 20 relative the outer lead portion 5b to facilitate electrical connection to the die(s) (e.g., via wire-bonding). For example, as shown in FIG. 1D, the inner lead portion 5a of each lead 5 can be vertically offset above the outer lead portion 5b such that the inner lead portion 5a is exposed at the upper surface 11 of the package substrate 2.

The exposed inner lead portions 5a can act as electrical contacts for wire bonds or other electrical connectors to connect to one or more integrated device dies. The outer lead portions 5b can be disposed below the inner lead portions 5b so as to be exposed at the lower surface 12 of the package substrate 2. The outer portions 5b can act as electrical contacts for connection to a system board of the larger electronic system. For example, the system board of a larger electronic system (such as a computing device, an automobile, etc.) may be soldered to the outer portions 5b of the leads 5. Overhangs created, for example, by half-etching portions of the lower surfaces of the leads 5 and metal die pad 4 can facilitate embedding in the mold, and at the outer edges of the outer portions 5b of the leads 5 can facilitate visual inspection of solder joints.

In addition, the package substrate 2 may comprise a dam 9 sized and shaped to receive a distal portion or lip of the package lid 6. For example, as shown in FIGS. 1C-1D, the dam 9 can include an inner annular wall 10a and an outer annular wall 10b spaced apart from the inner wall 10a. The dam 9 may comprise a portion of the molding material 3 of the substrate 2. Advantageously, the dam 9 can be sized to help align the lid 6 with the substrate 2. In addition, the dam 9 can help prevent bleedout of the epoxy which attaches the lid 6 to the substrate 2, e.g., the dam 9 can prevent the epoxy from leaking outside the package and/or from leaking onto the die pad 20, and can facilitate embedding a lid flange or lip in epoxy.

Figure 1E:
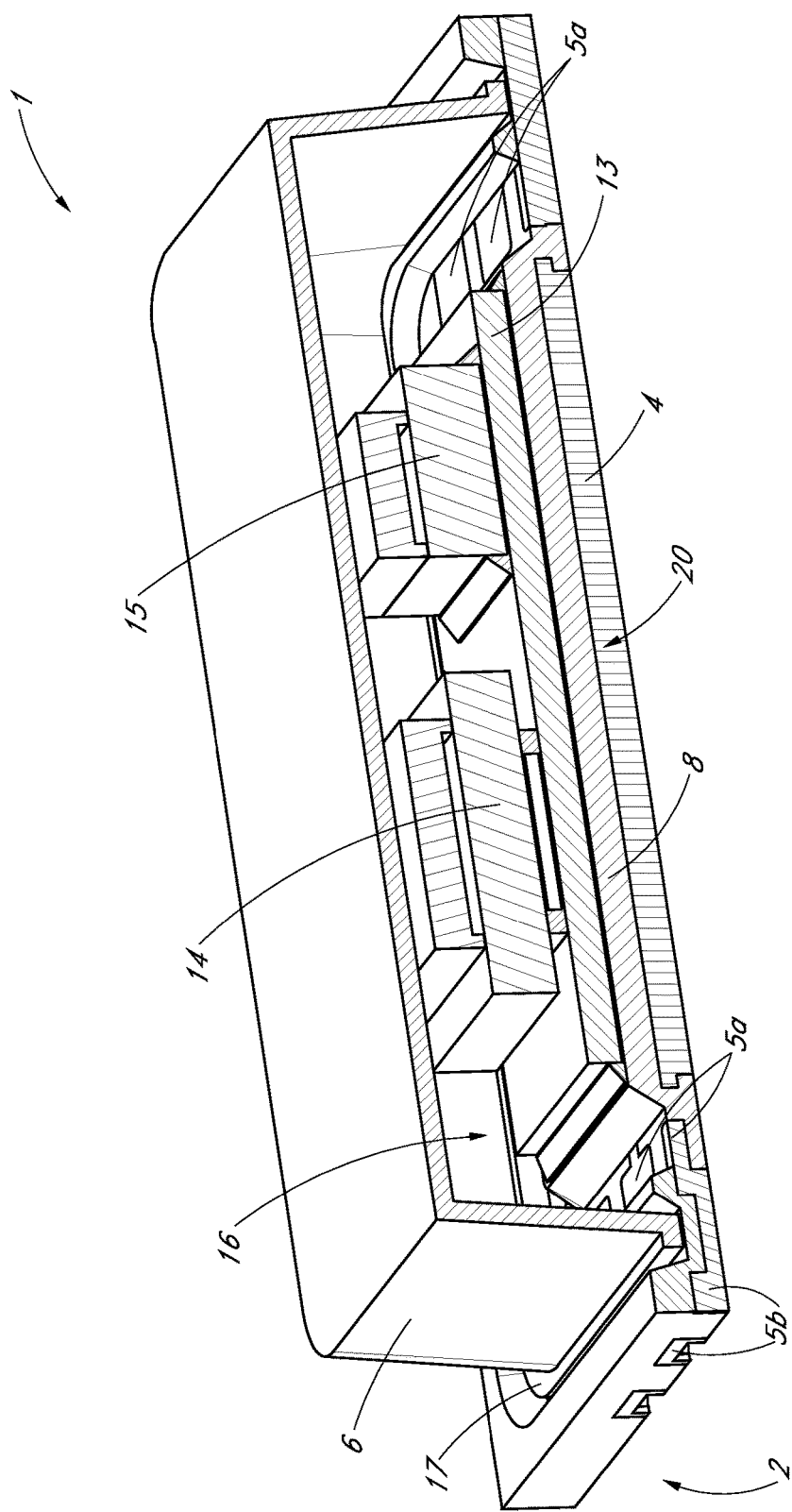
FIG. 1E is a schematic top, left and front perspective sectional view of the package shown in FIGS. 1A-1B.

FIG. 1E is a schematic perspective cross-sectional view of the package 1 shown in FIGS. 1A-1B. As shown in FIG. 1E, one or more integrated device dies may be mounted to the upper surface 11 of the package substrate 2. For example, a first integrated device die 13 may be mounted to the composite die pad 20 by way of an adhesive disposed between the die 13 and the composite die pad 20. In the embodiment of FIG. 1E, the first integrated device die 13 can be adhered to the upper surface 11 (see FIG. 1C) of the insulator die pad 8. A second integrated device die 14 and a third integrated device die 15 can be mounted on the first integrated device die 13. Although not illustrated in FIG. 1E, the first integrated device die 13 can be electrically connected to the inner lead portions 5a of the leads by one or more bonding wires or other electrical connectors. Each of the second integrated device die 14 and the third integrated device die 15 can be electrically connected to corresponding bond pads on the first integrated device die 13 by wire bonds or by way of a flip chip connection. Alternatively, the second and third device dies 14, 15 can electrically connect to the inner lead portions 5a by way of electrical connectors such as bonding wires.

The device dies 13-15 shown in FIG. 1E can be any suitable type of integrated device die, such as an integrated circuit die (e.g., an Application-Specific Integrated Circuit), a microelectromechanical systems (MEMS) die, or any other type of die. In the illustrated embodiment, the first die 13 can comprise a processor die, and the second and third dies 14, 15 can comprise motion sensor dies, such as MEMS motion sensor dies. For example, the second die 14 can comprise an accelerometer die, and the third die 15 can comprise a gyroscope die, or vice versa. In such embodiments, the first die 13 can receive and process electrical signals transduced by the second and third dies 14, 15. The first die 13 (and/or the second and third dies 14, 15) can electrically communicate with the larger electronic system by way of the leads 5.

Furthermore, as shown in FIG. 1E, the package lid 6 can be mounted to the upper surface 11 (see FIG. 1C) of the substrate 2 to define a cavity 16 in which the dies 13-15 are disposed. Advantageously, the cavity 16 can comprise an air cavity, which may serve to mechanically isolate the dies 13-15 from external forces and vibrations. The lid 6 can include a lip 17 extending outwardly from a wall of the lid 6. The lip 17 can act as a foot or support surface for the lid 6 and can be disposed between the walls 10a, 10b of the dam 9. An adhesive (such as a conductive epoxy or solder) can be applied between the lip 17 and the substrate 2 to attach the lid 6 to the substrate 2. In some embodiments, a portion of the adhesive can also be disposed over the lip so as to assist in locking or attaching the lid 6 to the substrate 2. In some embodiments, the adhesive may contact a lead or other electrical contact of the substrate 2 so as to electrically connect the lid 6 to ground to form an RF shield.

As shown in FIG. 1E, an area of a major surface of each of the integrated device dies 13-15 can be smaller than an area of a major surface of the insulator die pad 8 and an area of a major surface of the metal die pad 4. The device dies 13-15 can be disposed on top of the composite die pad 20 such that a plane parallel to the vertical direction can pass through the insulator die pad 8, the metal die pad 4, and one of the device dies 13-15. Further, every plane which is parallel to the vertical direction and which passes through one of the integrated device dies 13-15 can also pass through at least a portion of the insulator die pad 8 and at least a portion of the metal die pad 4.

In various embodiments, the metal leadframe can be patterned using a suitable masking and material removing process (e.g., an etching process) to define the metal die pad 4 and the leads 5. The resulting metal leadframe can be molded (e.g., by injection molding, overmolding, or any other suitable technique) so that the metallic die pad 4 and leads 5 are at least partially embedded or molded in the molding material 3. Integrated device dies 13-15 can be mounted to the upper surface 11 of the package substrate 2 by way of an adhesive and electrically connected to corresponding leads 5 (for example, by bonding wires). The lid 6 can be mounted to the substrate 2 over the dies 13-15 such that the dies 13-15 are disposed within the cavity 16. The lid 6 can be adhered to the substrate 2 by a conductive adhesive (e.g., epoxy or solder) in some embodiments so as to ground the lid 6 and form an RF shield. It should be appreciated that the molded leadframe may comprise a portion of a larger array of leadframes, and the array of leadframes may be singulated (for example, by sawing) to define a plurality of package substrates 2, such as after molding.

Advantageously, the package 1 shown in FIGS. 1A-1E can enable the use of molded leadframe cavity packages in which the package stiffness and resonant frequency can be accurately selected or controlled. In other packages which include only a metal die pad, the stress, vibration, and solder joint reliability may be limited by the available leadframe thicknesses and manufacturability. By using a composite die pad 20, the thickness of the overall die pad can be varied by applying different amounts of molding material 3 to define the insulator die pad 8. Thus, the stiffness and other mechanical properties of the composite die pad 20 can be controllably adjusted by using a metal die pad 4 with a predetermined thickness and by adjusting (during the mold process) the thickness of the molding material 3 for the insulator die pad 8. The stiffness can be tuned by the thickness of the molding material 3 in order to better resist transmission of external stresses to the dies. While the metal die pad 4 can also be omitted, maintenance of the metal die pad 4 can advantageously reduce the overall thickness of the die platform for a given stiffness.

Figure 1F:
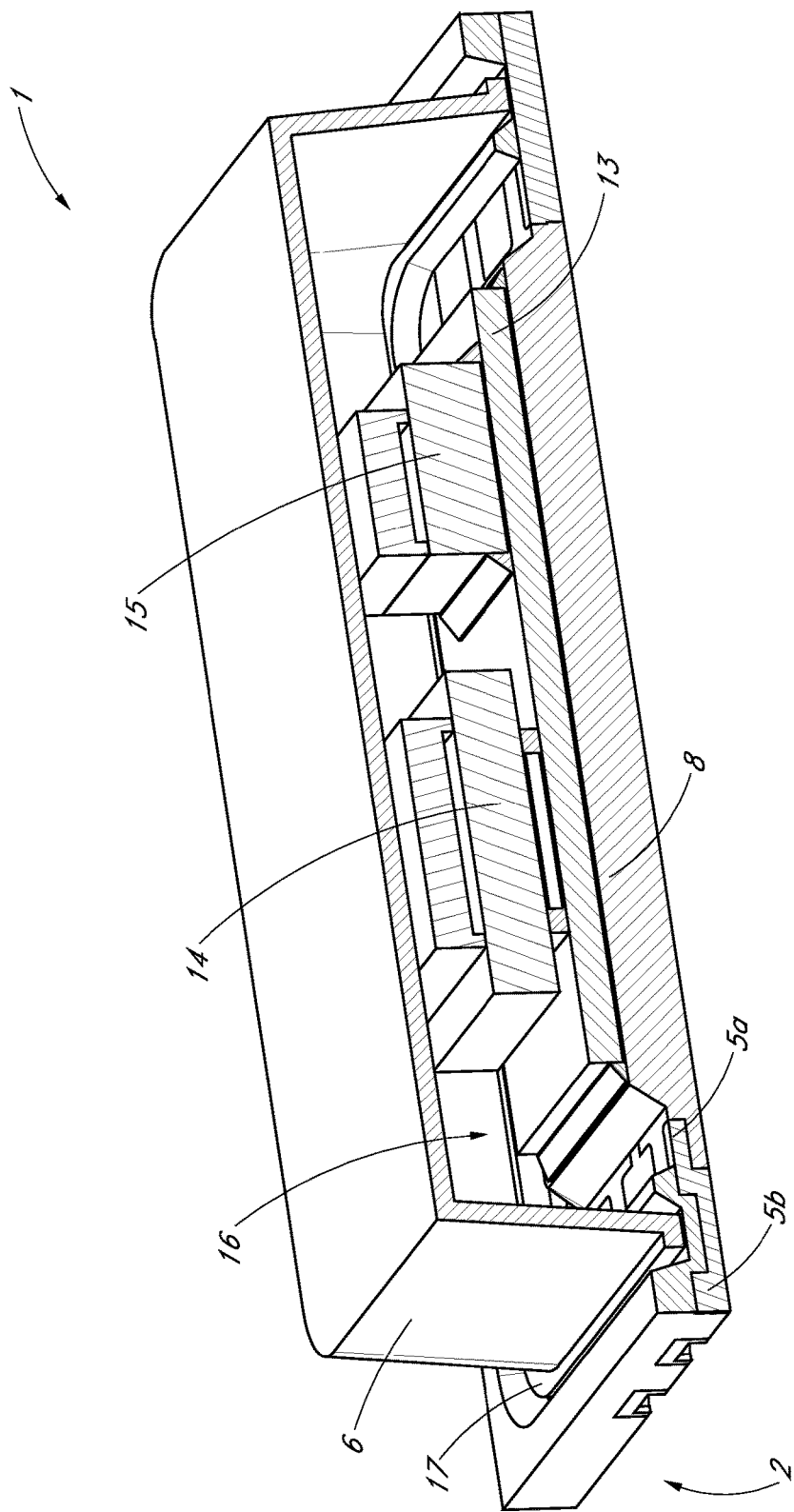
FIG. 1F is a schematic top, left and front perspective sectional view of a package, according to another embodiment.

FIG. 1F is a schematic perspective cross-sectional view of a package 1, according to another embodiment. The components of FIG. 1F may have reference numerals similar to those set forth in FIGS. 1A-1E, unless otherwise specified. Unlike in the embodiment of FIGS. 1A-1E, in the arrangement of FIG. 1F, the dies 13-15 are mounted on a die pad region comprising an insulator die pad 8, which may not include a metal die pad. In the illustrated embodiment, the die pad comprises comprise only (or substantially only) an insulating material, e.g., the molding material 3. Thus, in FIG. 1F, the molding material 3 may be exposed on both the upper surface 11 of the package substrate 2 and the lower surface 12 of the package substrate 2. As with the embodiment of FIGS. 1A-1E, the thickness of the insulator die pad 8 may be selected in the design of the mold to achieve a desired package stiffness and/or resonant frequency. The overall thickness of the insulator die pad 8 may be in the same ranges as the overall thicknesses disclosed above with respect to the insulator die pad 8 of FIGS. 1A-1E, e.g., in a range of about 50 microns to 2 mm.

Figure 2A:
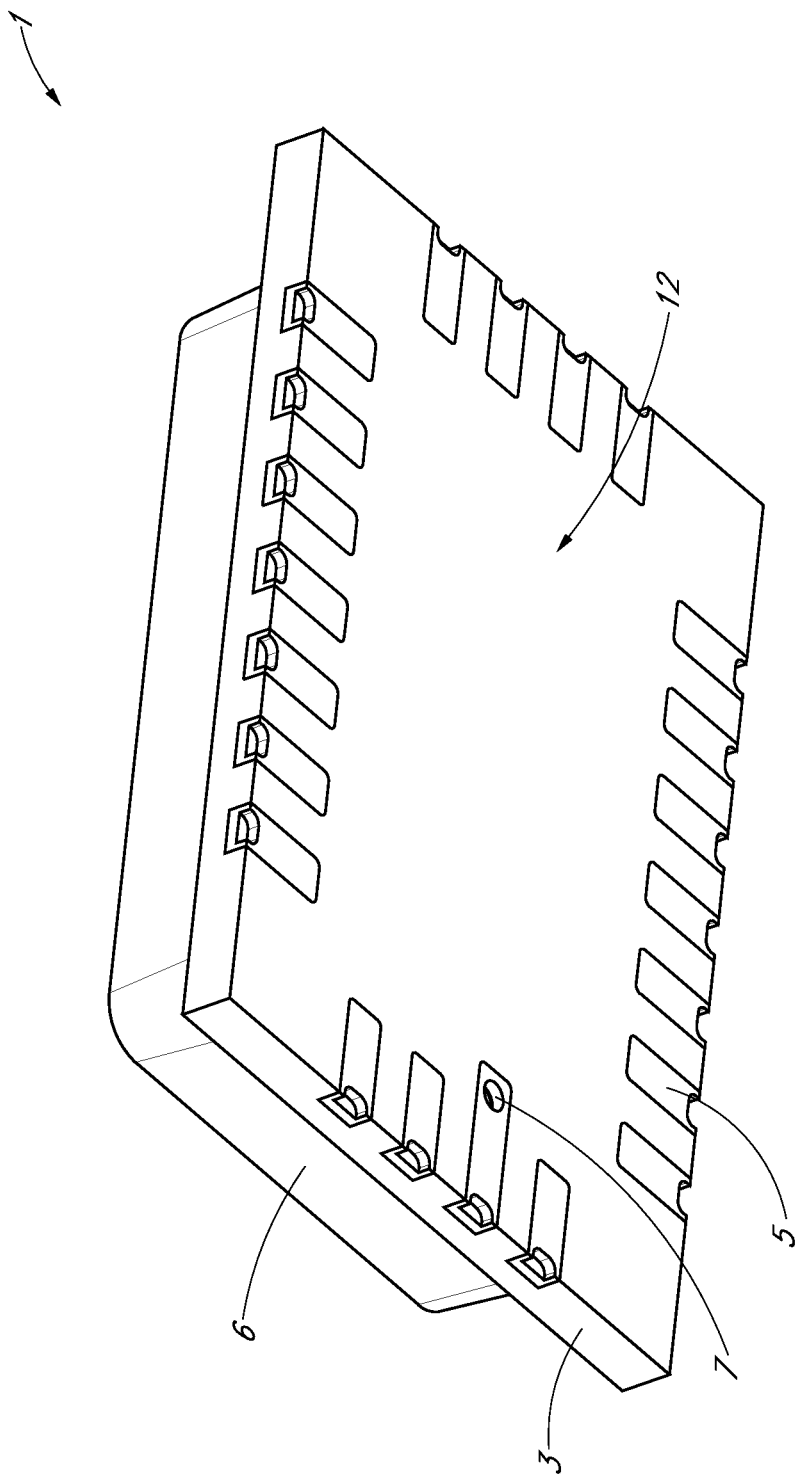
FIG. 2A is a schematic bottom, left and front perspective view of an integrated device package, according to another embodiment.
Figure 2B:
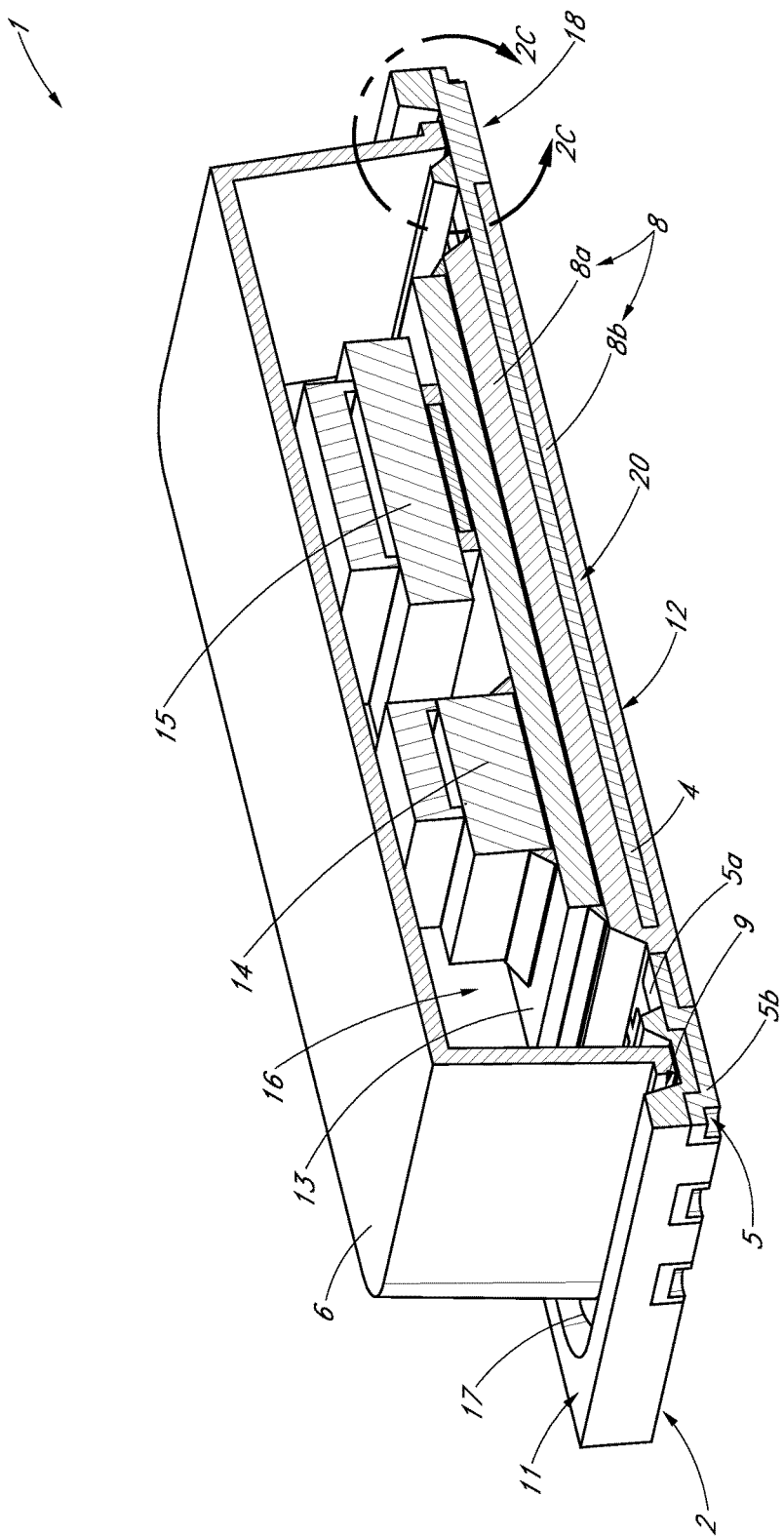
FIG. 2B is a schematic top, left and front perspective sectioned view of the package shown in FIG. 2A.

FIG. 2A is a schematic, bottom perspective view of an integrated device package 1, according to another embodiment. FIG. 2B is a schematic perspective cross-sectional view of the package 1 shown in FIG. 2A. Unless otherwise noted, the reference numerals used in FIGS. 2A-2B represent the same or generally similar components as those indicated by the same reference numerals used in FIGS. 1A-1E. For example, as with the embodiment shown in FIGS. 1A-1E, the package 1 can include a package substrate 2, one or more dies 13-15 mounted to the package substrate 2, and a package lid 6 mounted to the package substrate 2 to define a cavity 16 in which the die(s) 13-15 are disposed. The die(s) 13-15 can electrically connect to the inner lead portions 5a of the leads 5 by way of a suitable electrical connector, such as a bonding wire (not shown). The outer lead portions 5b can be configured to electrically connect to a system board by way of, for example, solder balls. As with the embodiments of FIGS. 1A-1F, the lid 6 can be attached to the substrate 2 such that the lip 17 of the lid 6 is disposed within the dam 9 of the substrate 2. An adhesive (such as a conductive epoxy or solder) can be disposed between the lip 17 and the substrate 2, and may also be disposed over the top of the lip 17, to secure the lid 6 to the substrate 2.

Furthermore, as with the embodiment of FIGS. 1A-1E, the die(s) 13-15 can be mounted to a composite die pad 20, which can include a metal die pad 4 and an insulator die pad 8. However, unlike the embodiment shown in FIGS. 1A-1E, in the embodiment of FIGS. 2A-2B, the metal die pad 4 can be embedded within the insulator die pad 8. For example, as shown in FIG. 2B, the metal die pad 4 can be disposed between an upper insulator pad 8a and a lower insulator pad 8b. The upper and lower insulator pads 8a, 8b can be joined around the perimeter (or a portion thereof) of the metal die pad 4 such that the metal die pad 4 is substantially enclosed or embedded in the insulator die pad 8. As with the embodiment of FIGS. 1A-1E, the insulator die pad 8 (including the upper and lower pads 8a, 8b) can comprise a portion of the molding material 3, and the metal pad 4 can comprise a portion of the metallic leadframe. Thus, in the embodiment of FIG. 2B, the upper insulator pad 8a can be exposed at the upper surface 11 of the substrate 2, and the lower insulator pad 8b can be exposed at the lower surface 12 of the substrate 2.

Advantageously, the thickness of the insulator die pad 8 can be selected to provide an overall composite pad 20 thickness (i.e., the sum of the thickness of the upper pad 8*a*, the thickness of the metal die pad 4 and the thickness of the lower pad 8*b*) sufficient to withstand operating loads and vibrations. As with the embodiment of FIGS. 1A-1B, the overall thickness can be selected to control the resonant frequency and stiffness of the package 1 to resist transmission of excessive external stresses to the dies 13-15.

For example, in various embodiments, the thickness of the upper insulator pad 8*a* can be in a range of 25 microns to 2 mm, in a range of 50 microns to 1 mm, or more particularly, in a range of 50 microns to 500 microns. The thickness of the lower insulator pad 8*b* can be in a range of 25 microns to 2 mm, in a range of 50 microns to 1 mm, or more particularly, in a range of 50 microns to 500 microns. The overall or total thickness of the insulator pad 8 (i.e., the sum of the thicknesses of the upper and lower pads 8*a*, 8*b*) can be in a range of 50 microns to 4 mm, in a range of 50 microns to 2 mm, or more particularly, in a range of 100 microns to 1 mm. The thickness of the metal pad 4 can be in a range of 50 microns to 500 microns, or in a range of 100 microns to 300 microns.

Figure 2C:
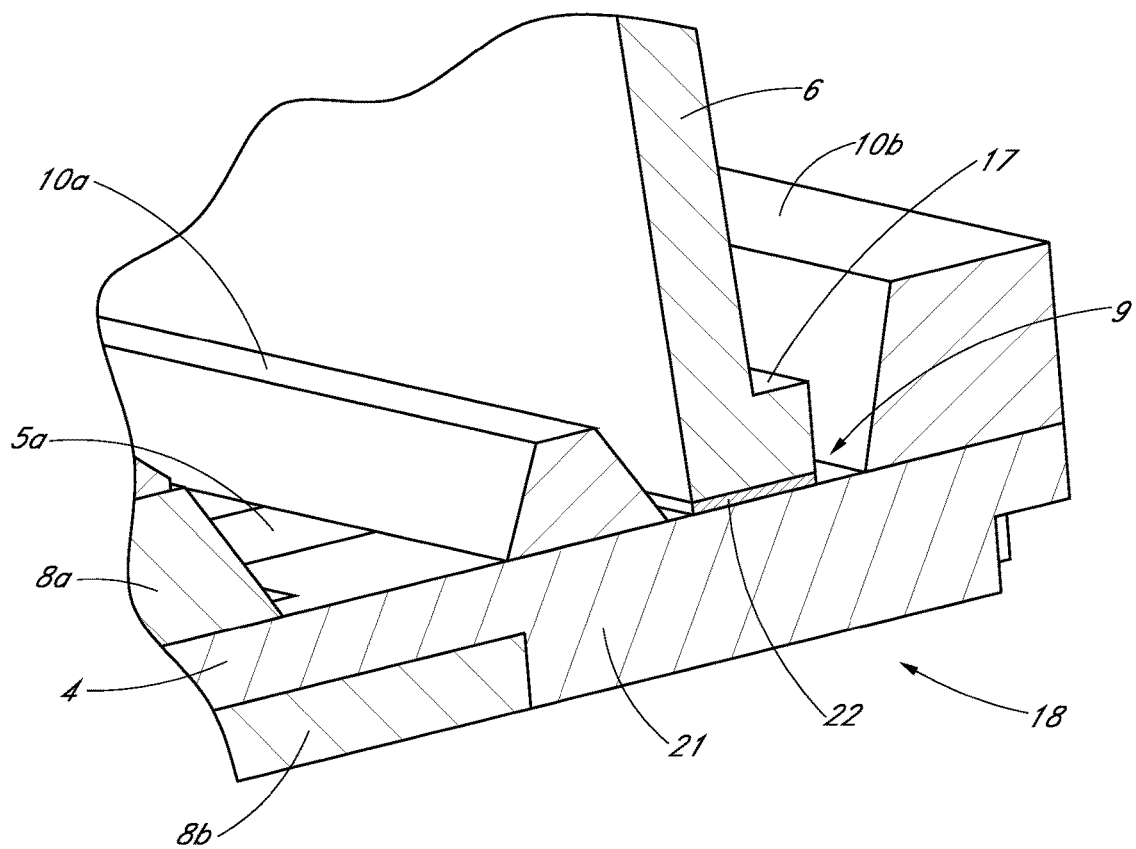
FIG. 2C is a magnified view of the fused lead structure shown in FIG. 2B.

Furthermore, as shown in FIG. 2B, the package substrate 2 can comprise a fused lead structure 18 which may be used to ground the package 1, for example, by providing an electrical connection between the fused lead structure 18 and a corresponding ground bond pad 21 of the system board of the larger electronic system. FIG. 2C is a schematic, magnified perspective cross-sectional view of the fused lead structure 18 shown in FIG. 2B. The fused lead structure 18 can comprise a portion of the metallic leadframe configured to provide connection to electrical ground. For example, as shown in FIG. 2C, the fused lead structure 18 can be disposed underneath the dam 9 defined by the two walls 10*a*, 10*b*. The lip 17 of the lid 6 can electrically contact the fused lead structure 18 by way of a conductive adhesive 22 (for example, epoxy or solder). Thus, the fused lead structure 18 can be used to electrically ground the lid 6 to form an RF shield. It should be appreciated that, although not illustrated in connection with FIGS. 1A-1E, the fused lead structure 18 of FIGS. 2A-2B may also be used in conjunction with the embodiment of FIGS. 1A-1E.

Figure 2D:
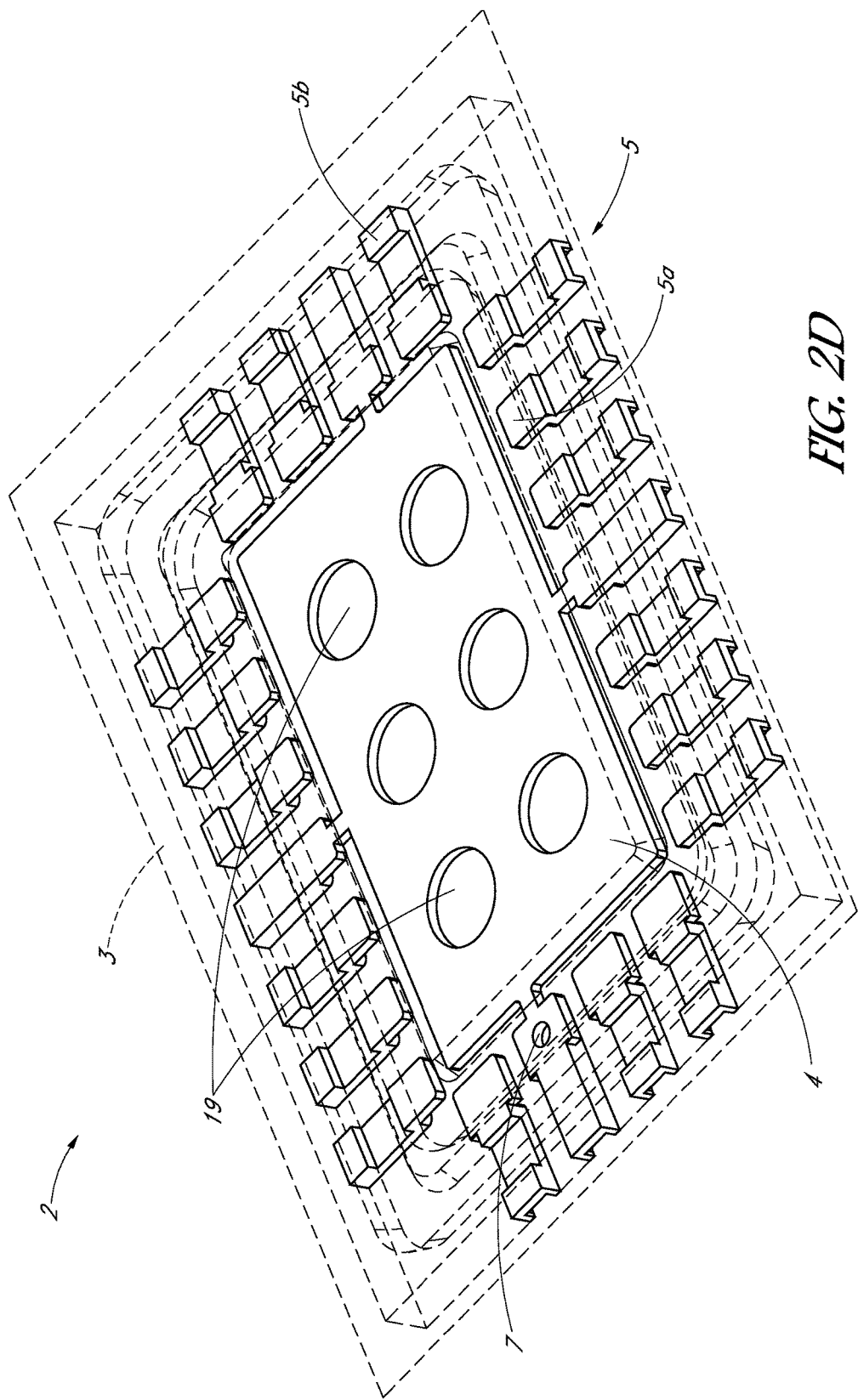
FIG. 2D is a schematic perspective view of a package substrate showing the lead from of one embodiment in solid lines and the molding in phantom, in accordance with various embodiments.

FIG. 2D is a schematic perspective view of a package substrate 2, in accordance with various embodiments. In FIG. 2D, the molding material 3 is shown in phantom lines for purposes of clarity such that only the metallic leadframe (e.g., the leads 5 and metal die pad 4) is illustrated in solid lines. In various embodiments, the composite die pad can be further modified to control the stiffness of the substrate. For example, in addition to (or as an alternative to) adjusting the thickness of the molding material 3 which forms the insulator die pad 8, the metal die pad 4 and/or the insulator die pad 8 can be patterned to adjust the overall stiffness of the substrate 2 and package 1. As shown in FIG. 2D, holes 19 can be formed in the metal die pad 4 and can be filled with the molding material 3 to modify the substrate stiffness. Although the holes 19 shown in FIG. 2D are through holes (i.e., through the entire thickness of the metal die pad 4), it should be appreciated that, in other arrangements, the holes 19 may comprise recesses or blind holes which are not formed through the entire thickness of the metal die pad 4. The holes 19 illustrated in FIG. 2F are generally round (e.g., circular or elliptical), but in other embodiments, the holes 19 can be any suitable shape, such as rectangular, parallelopipedal, etc. Moreover, the holes 19 may have different sizes at different locations of the metal die pad 4, in various arrangements.

Thus, in the embodiment of FIG. 2D, the stiffness of the package 1 can be further adjusted by patterning the metal die pad 4 with holes 19 (e.g., through holes or recesses) and filling the pattern with molding material 3. The resulting modifications to the cross-sectional profile of the package substrate 2 may thereby also modify the stiffness of the package 1 to reduce the transmission of stresses to the dies and/or to control the resonant frequency of the package 1. In the embodiment of FIG. 2D, the metal die pad 4 can be disposed on top of the insulator die pad, below the insulator die pad, or embedded within the insulator die pad.

Figure 3A:
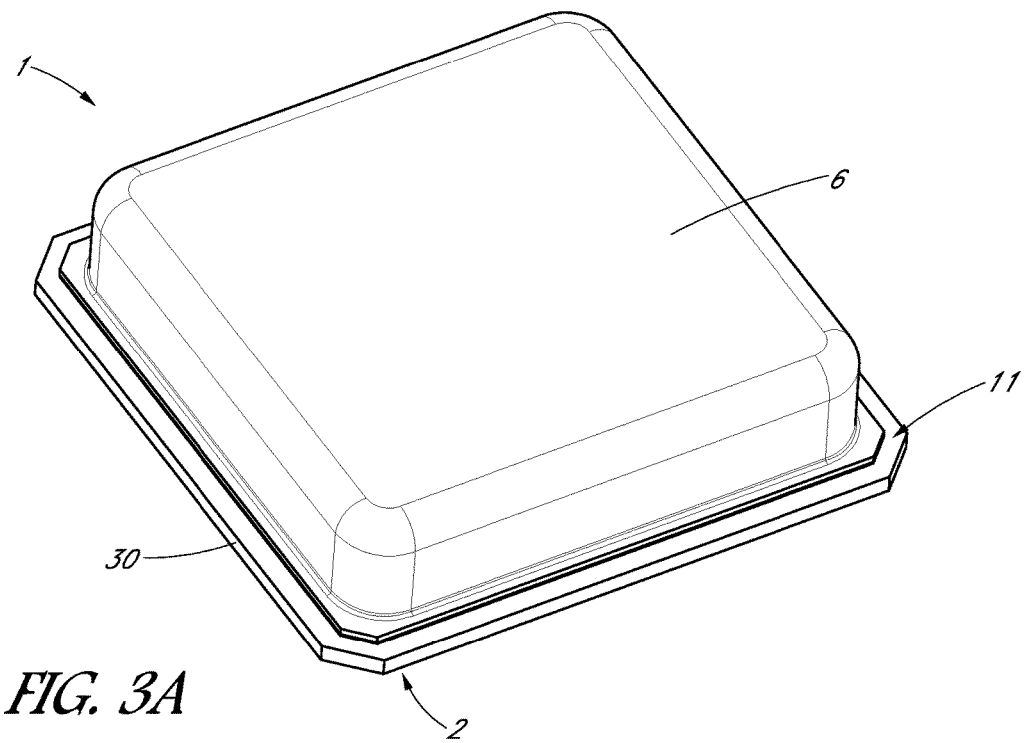
FIG. 3A is a schematic top, left and front perspective view of an integrated device package, according to another embodiment.
Figure 3B:
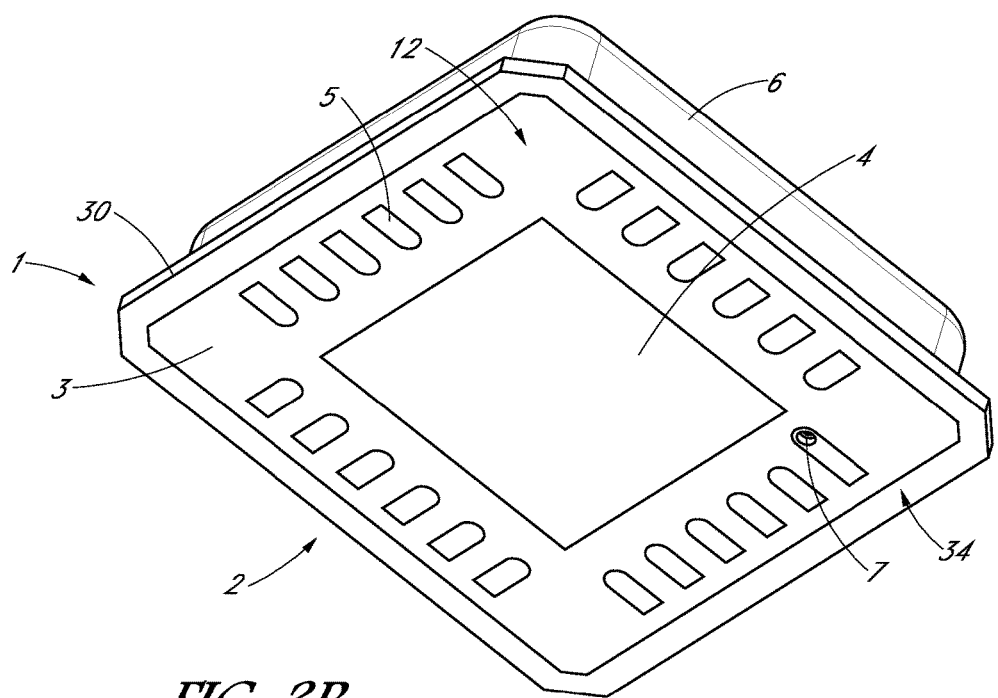
FIG. 3B is a schematic bottom, left and front perspective view of the package shown in FIG. 3A.
Figure 3C:
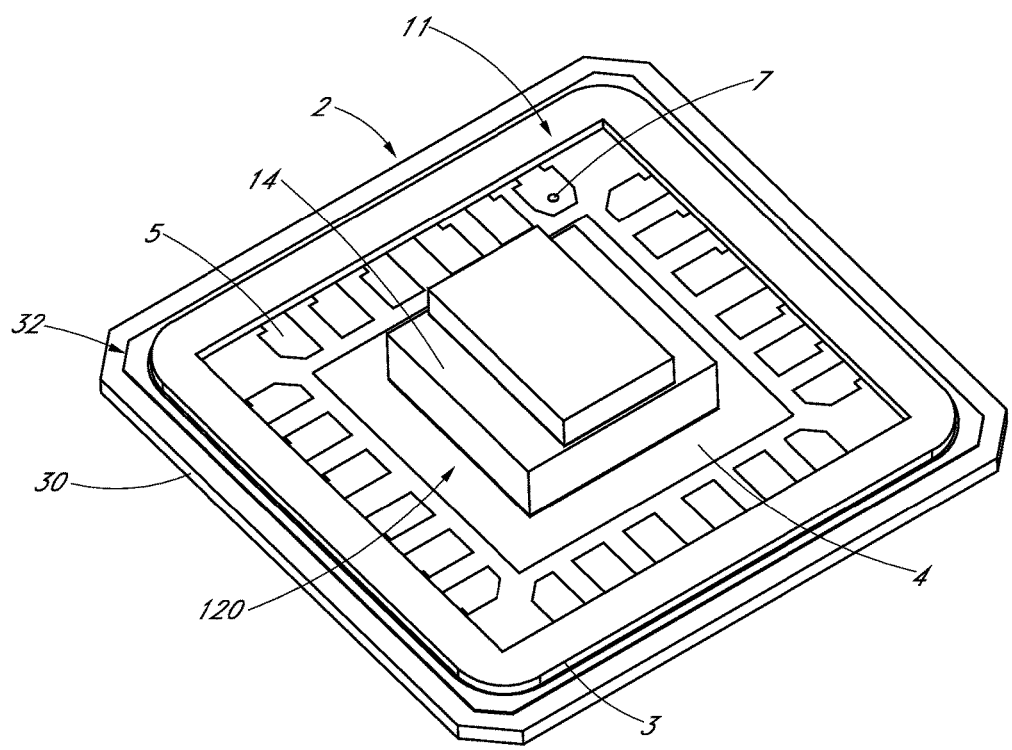
FIG. 3C is a schematic top, left and front perspective view of the package shown in FIGS. 3A-3B, with a lid removed for purposes of illustration.

FIG. 3A is a schematic top perspective view of an integrated device package 1, according to another embodiment. FIG. 3B is a schematic, bottom perspective view of the package 1 shown in FIG. 3A. FIG. 3C is a schematic top perspective view of the package 1 shown in FIGS. 3A-3B, with the lid 6 removed for purposes of illustration. Unless otherwise noted, the reference numerals used in FIGS. 3A-3C represent the same or generally similar components as those indicated by the same reference numerals used in FIGS. 1A-1E and 2A-2D. For example, as with the embodiments of FIGS. 1A-2D, the package 1 can include a package substrate 2, one or more dies 14 mounted to the package substrate 2, and a package lid 6 mounted to the package substrate 2 to define a cavity in which the die(s) 14 is (are) disposed. The leads 5 shown in FIGS. 3A-3C may be formed through a thickness of the substrate 2 so as to have portions exposed at the upper surface 11 of the substrate 2 and at portions exposed at the lower surface 12 of the substrate 2. The die 14 can electrically connect to the leads 5 by way of a suitable electrical connector, such as a bonding wire (not shown). The exposed lower surfaces of the leads 5 can be configured to electrically connect to a system board by way of, for example, solder balls.

The device die 14 can be mounted on a central die pad 120, which may comprise only a metal die pad 4, only an insulating die pad such as the solely insulating die pad of FIG. 1F, or a composite die pad that includes metal and insulating materials such as the composite die pads 20 illustrated in FIGS. 1A-1E and 2A-2D. In the embodiment of FIGS. 3A-3C, the central die pad 120 comprises a metal die pad 4. The die 14 can electrically connect to the signal leads 5 that surround the die pad 120, for example, by way of bonding wires. In addition, an outer metal ring 30 (e.g., an annular metal layer) can be disposed about the outer perimeter of the substrate 2 such that the ring 30 surrounds the leads 5 (and any molding material 3 in which the leads 5 are embedded). The leads 5 are thus inset relative to the metal ring 30. The metal ring 30 can be exposed on (or define portions of) the upper and lower surfaces 11, 12 of the substrate 2. In various embodiments, the ring 30 can comprise a continuous structure disposed about all sides of the substrate 2. In other embodiments, the ring 30 may comprise a gap such that the ring does 30 is not completely closed. The package lid 6 can be attached to an exposed top surface 32 of the ring 30 by way of an adhesive (e.g., a conductive epoxy). The metal ring 30 can electrically connect the package lid 6 to a ground contact, e.g. on the system board, such that the lid 6 can act as an RF shield in some arrangements. In some embodiments, the lip of the lid 6 may be disposed in a recessed portion of the exposed top surface 32 of the ring 30 so that the recessed portion may help in aligning and securing the lid 6 to the substrate 2.

An exposed bottom surface 34 of the metal ring 30 can be adhered to a system board, such as a printed circuit board, or PCB, by way of a suitable electrical connection (such as solder). As with the embodiments of FIGS. 1A-2D, the substrate 2 can comprise a vent hole 7. When the metal ring 30 is attached to the system board, air can escape from the cavity of the package by way of the vent hole 7, and the cavity can be hermetically sealed by the solder which connects the ring 30 to the system board. Alternatively, the solder applied to the ring may not be completely enclosed and can allow air to escape the package. Thus, the metal ring 30 disclosed herein can provide a convenient mechanism by which the lid 6 can be attached and grounded to the substrate 2, and by which the substrate 2 can be attached to the system board while maintaining a high solder joint reliability (SJR). Furthermore, using the metal ring 30 spaced apart from the die pad 120 to connect to the external device (e.g., system board) may isolate the die(s) 14 from external stresses transmitted through the solder from the external device or system board. By contrast, in other packages, the die pad may be soldered to the system board, which can generate stresses in the die pad and device die. Accordingly, the ring 30 can advantageously enable the package 1 to be attached to the system board over a larger surface area than that provided by the leads 5 without generating stresses in the die 14 by way of the die pad.

Figure 4A:
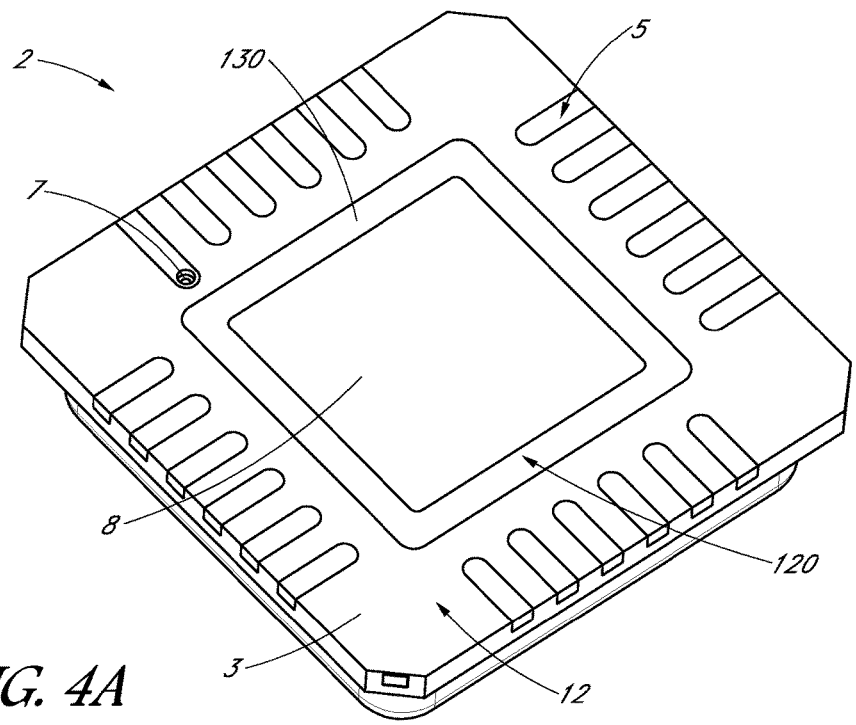
FIG. 4A is a schematic bottom perspective view of a package substrate, according to another embodiment.

FIG. 4A is a schematic bottom perspective view of a package substrate 2, according to another embodiment. Unless otherwise noted, the reference numerals used in FIG. 4A represents the same or generally similar components as those indicated by the reference numerals used in FIGS. 1A-3C. For example, the package substrate 2 can comprise a molded leadframe in which a plurality of leads 5 are embedded or molded with a molding material 3. The substrate 2 can also comprise a central die pad 120, which may comprise an insulating die pad 8 such as the solely insulating die pad 8 of FIG. 1F, or a composite die pad that includes metal and insulating materials such as the composite die pads 20 illustrated in FIGS. 1A-1E and 2A-2D. In the embodiment of FIG. 4A, the molding material 3 (e.g., a portion of an insulator substrate 8) is exposed at the lower surface 12 of the substrate 2.

In the embodiment of FIG. 4A, an annular metal seal or metal ring 130 can be disposed about at least a portion of the perimeter of the central die pad 120 between the central die pad 120 and the leads 5. Thus the metal ring 130 is inset relative to the leads 5. The metal ring 130 can be exposed on, or can define a portion of, the lower surface 12 of the package substrate 2. In some arrangements, the ring 130 can extend through the thickness of the substrate so as to be exposed on, or to define a portion of, the upper surface of the substrate 2. In other embodiments, the ring 130 can extend only partially through the thickness of the substrate 2. As with the embodiment of FIGS. 3A-3C, the ring 130 can be soldered or otherwise electrically connected to a system board, such as a PCB. As explained above, by soldering the system board to the ring 130 at a location spaced apart from the die pad 120, stresses transmitted to the die pad 120 and die(s) may be reduced or eliminated while still allowing attachment over a larger surface area than that provided by the leads 5.

Figure 4B:
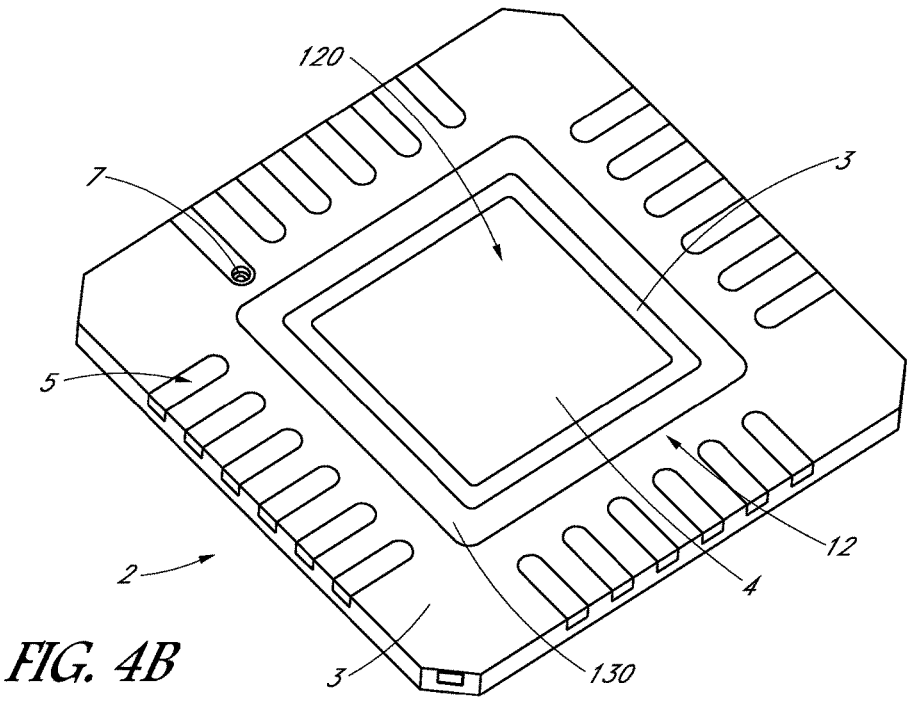
FIG. 4B is a schematic bottom perspective view of a package substrate, according to yet another embodiment.

FIG. 4B is a schematic bottom perspective view of a package substrate 2, according to yet another embodiment. Unless otherwise noted, the reference numerals used in FIG. 4B represents the same or generally similar components as those indicated by the reference numerals used in FIGS. 1A-4A. For example, the package substrate 2 can comprise a molded leadframe in which a plurality of leads 5 are embedded or molded with a molding material 3. The substrate 2 can also comprise a central die pad 120, which may comprise only a metal die pad 4, or a composite die pad that includes metal and insulating materials such as the composite die pads 20 illustrated in FIGS. 1A-1E and 2A-2D. In the embodiment of FIG. 4B, the metal die pad 4 is exposed at the lower surface 12 of the substrate 2.

In the embodiment of FIG. 4B, an annular metal seal or metal ring 130 can be disposed about at least a portion of the perimeter of the central die pad 120 (e.g., the metal die pad 4) between the central die pad 120 and the leads 5. Like FIG. 4A, the metal ring 130 is thus inset relative to the leads 5. The metal ring 130 can be exposed on, or can define a portion of, the lower surface 12 of the package substrate 2 and is separated from the metal die pad 4 by a portion of the molding material 3. As with the embodiments of FIGS. 3A-4A, the ring 130 can be soldered or otherwise electrically connected to a system board, such as a PCB. As explained above, by soldering the system board to the ring 130 at a location spaced apart from the die pad 120, stresses transmitted to the die pad 120 and die(s) may be reduced or eliminated while still allowing attachment over a larger surface area than that provided by the leads 5.

Figure 4C:
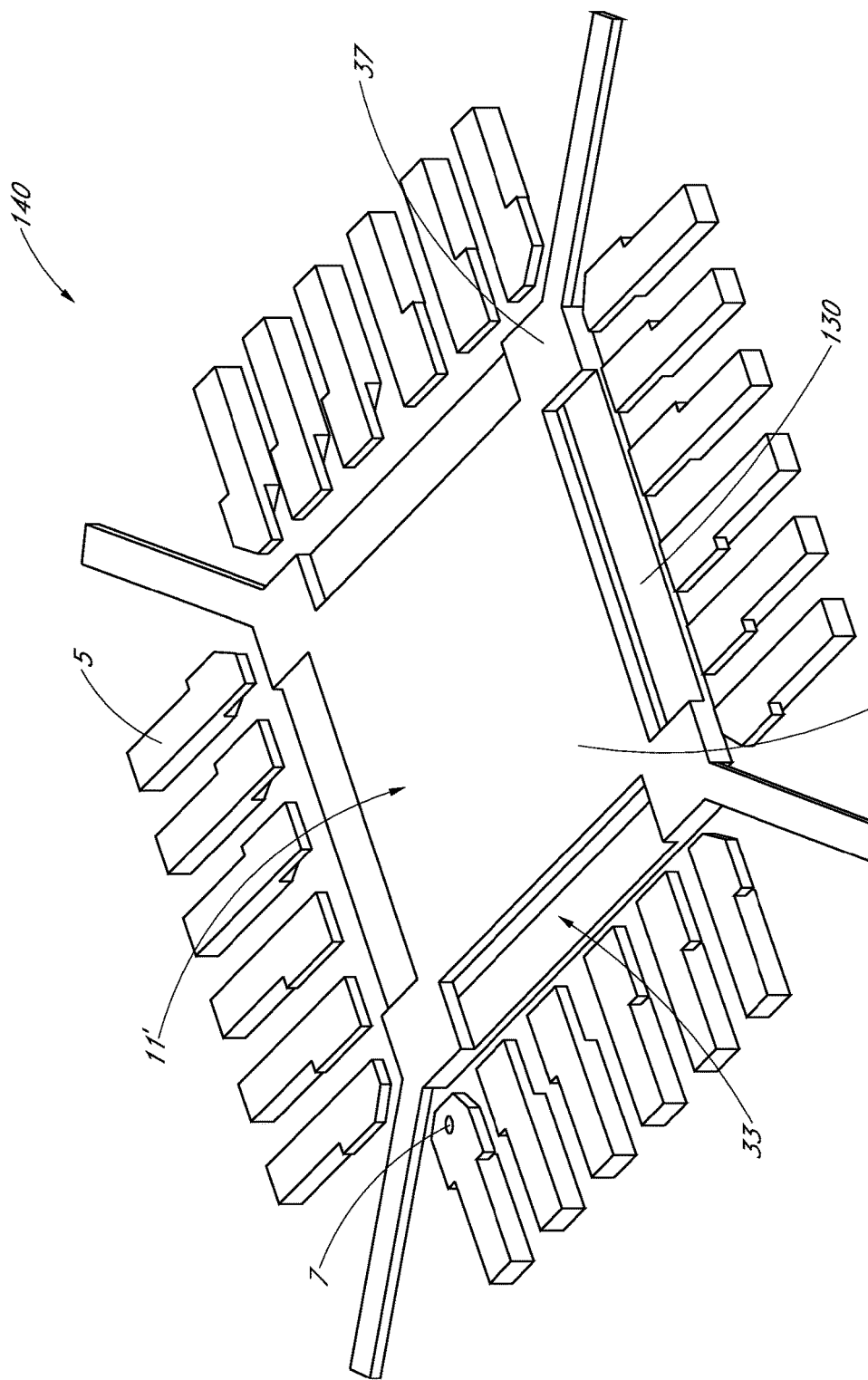
FIG. 4C is a schematic perspective view of an upper surface of a metal leadframe used in the embodiment of FIG. 4B.
Figure 4D:
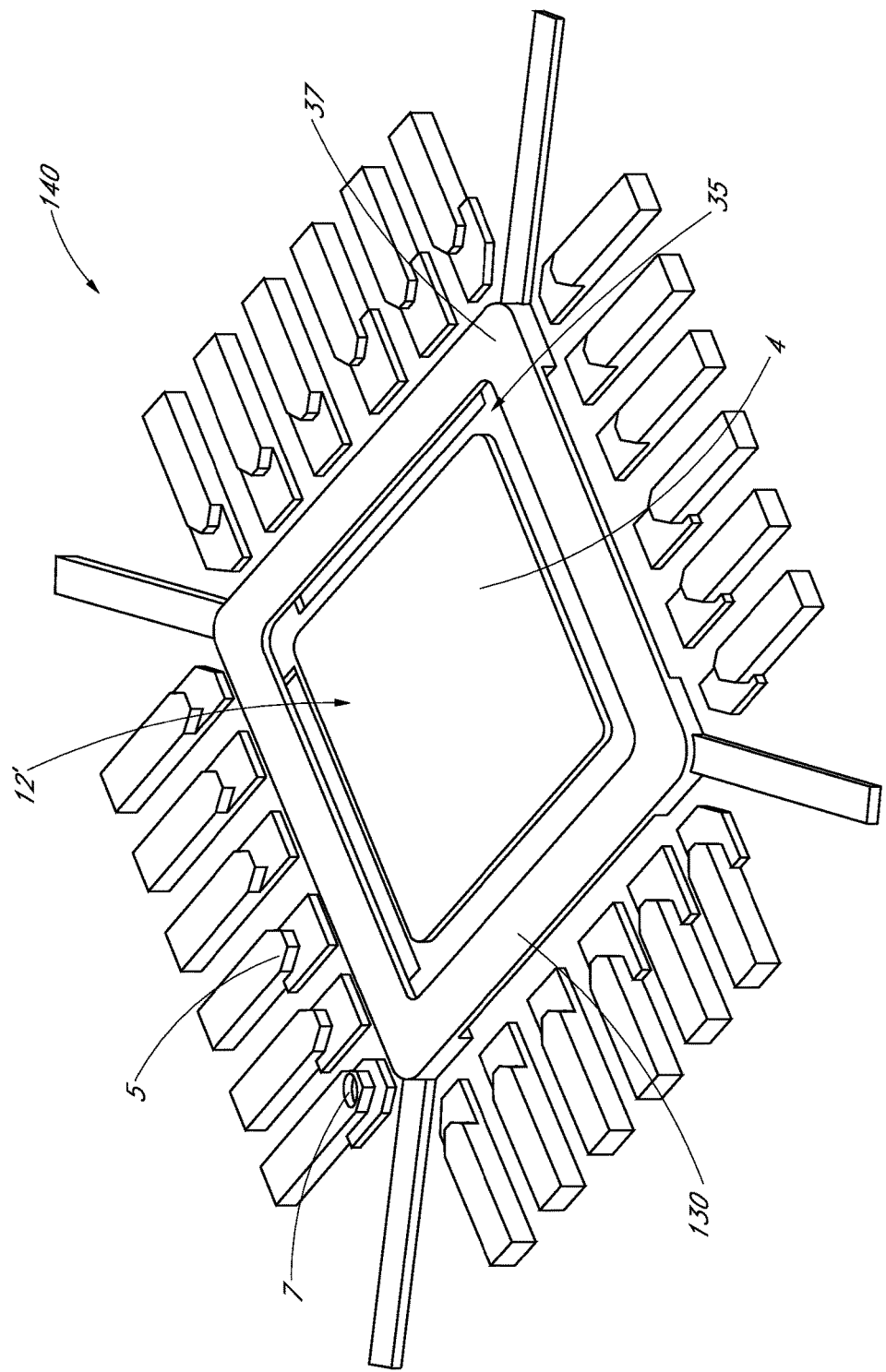
FIG. 4D is a schematic perspective view of a bottom surface of the metal leadframe shown in FIG. 4C.

FIG. 4C is a schematic top perspective view of an upper surface 11' of a metal leadframe 140 used in the embodiment of FIG. 4B. FIG. 4D is a schematic bottom perspective view of a lower surface 12' of the metal leadframe 140 shown in FIG. 4C. The metal leadframe 140 shown in FIG. 4C-4D is illustrated without the molding material 3 for ease of illustration, but it will be appreciated that molding material forms the packaging substrate as described in prior embodiments, with or without insulating die pad features above and/or below the metal die pad 4 to add stiffness as shown in FIGS. 4A and 4B. The metal leadframe 140 can comprise the metal die pad 4 and the plurality of leads 5. As shown in FIG. 4C, a portion of the leadframe 140 can be etched (e.g., half-etched) to define an upper recess 33 in the top surface of the metal ring 130. As shown in FIG. 4D, a portion of the leadframe 140 can be etched (e.g., half-etched) to define a lower recess 35 in the lower surface of the metal die pad 4 about the periphery of the metal die pad 4. Thus, the recesses 33 and 35 can cooperate to form a gap between the ring 130 and the metal die pad 4. A metal connecting portion 37 can electrically connect the ring 130 to the die pad 4 in some arrangements.

Figure 4E:
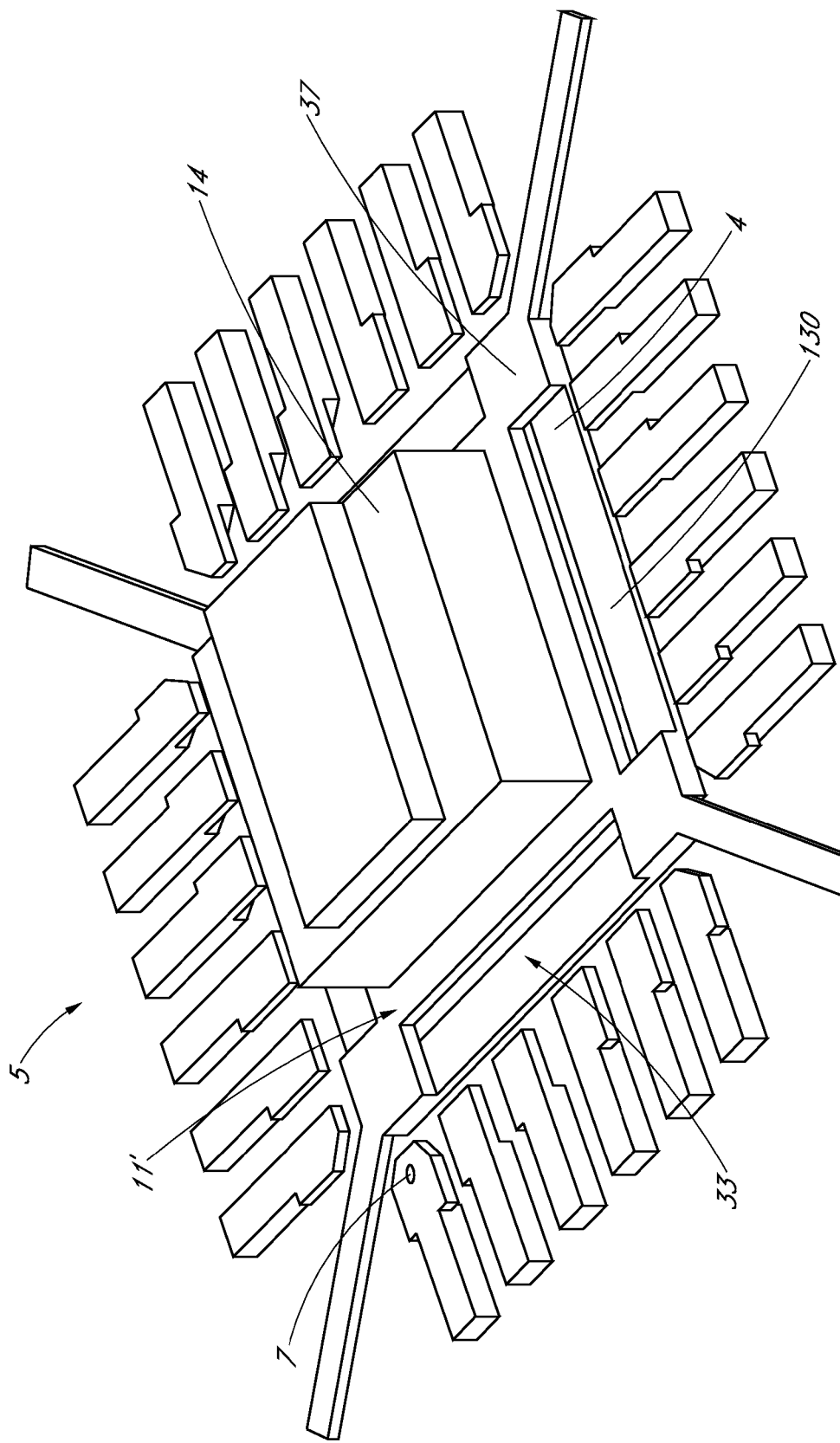
FIG. 4E is a schematic top, left and front perspective view of an integrated device die mounted to the top surface of the metal leadframe of FIG. 4C with molding omitted for purposes of illustration.
Figure 4F:
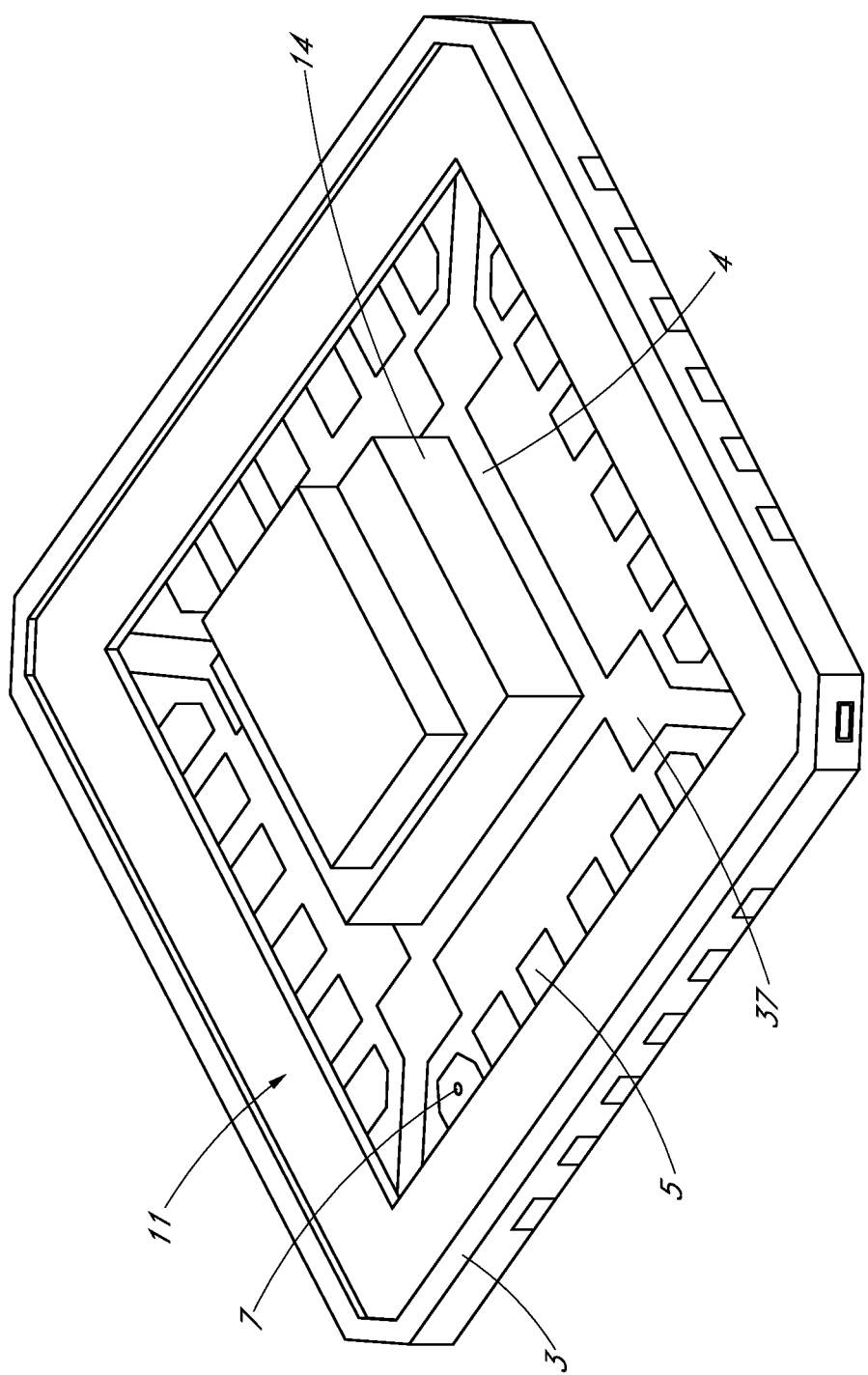
FIG. 4F is a schematic top, left and front perspective view of the integrated device die mounted to the upper surface of the package substrate of FIG. 4C with molding shown and lid omitted for purposes of illustration.

FIG. 4E is a schematic top perspective view of an integrated device die 14 mounted to the upper surface 11' of the metal leadframe 140, with the molding material omitted for purposes of illustration. As with the embodiments of FIGS. 1A-3C, the integrated device die 14 can comprise any suitable type of die, such as a processor die, a MEMS die (such as a motion sensor die), etc. Although not shown in FIG. 4E, the die 14 can be electrically connected to the leads 5 by way of, for example, bonding wires. FIG. 4F is a schematic top perspective view of the integrated device die 14 mounted to the upper surface 11 of the package substrate 2. In FIG. 4F, the molding material 3 is illustrated. As shown in FIGS. 4A, 4B and 4F, therefore, the metal ring 120 or 130 may be exposed on the lower surface 12 of the package substrate 2 but not on the upper surface 11. In some embodiments, the device die 14 can electrically connect to the die pad 4, connecting portion 37, and/or the metal ring 130, for example, to ground the device die 14. The metal ring 130 can advantageously enable a solder connection with the system board which has high solder joint reliability. By contrast, the die pad 4 may not be soldered to the system board, which can provide stress isolation for the die 14. As explained herein, instead of using a metal die pad 4 for the package substrate, a composite die pad can instead be used such that molding material or metal can be exposed on the lower surface of the substrate 2, as shown in FIGS. 4A and 4B.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An integrated device package comprising:
    a package substrate comprising:
        a composite die pad having an upper surface and a lower surface spaced from the upper surface along a vertical direction, the composite die pad comprising a metal die pad and an insulator die pad comprising an insulating material, the insulator die pad being disposed on the metal die pad such that the insulator die pad is exposed at the upper surface of the composite die pad; and
        a plurality of leads disposed about at least a portion of a perimeter of the insulator die pad;
    an integrated device die disposed on and mounted to the insulator die pad; and
    a package lid mounted to the package substrate to define a cavity, the integrated device die disposed within the cavity.

2. The package of claim 1, wherein the package substrate comprises a molded leadframe in which a metal leadframe is at least partially embedded in a molding material.

3. The package of claim 1, wherein the insulator die pad and the metal die pad are disposed adjacent one another along the vertical direction and the metal die pad is exposed at the lower surface of the composite die pad.

4. The package of claim 1, wherein the package lid is electrically grounded to form a radio frequency (RF) shield.

5. The package of claim 1, further comprising an adhesive disposed between the composite die pad and the integrated device die.

6. An integrated device package comprising:
    a package substrate comprising:
        an insulator die pad comprising an insulating material; and
        a plurality of leads disposed about at least a portion of a perimeter of the insulator die pad;
    an integrated device die mounted over the insulator die pad;
    a package lid mounted to the package substrate to define a cavity, the integrated device die disposed within the cavity; and
    an annular metal ring disposed about the insulator die pad such that the insulator die pad is within the annular metal ring.

7. The package of claim 6, wherein the package substrate comprises a composite die pad having an upper surface and a lower surface spaced from the upper surface along a vertical direction, the composite die pad comprising the insulator die pad and a metal die pad, and wherein the metal die pad is disposed on top of the insulator die pad such that the metal die pad is exposed at the upper surface of the composite die pad and the insulator die pad is exposed at the lower surface of the composite die pad.

8. The package of claim 6, wherein the package substrate comprises a composite die pad having an upper surface and a lower surface spaced from the upper surface along a vertical direction, the composite die pad comprising the insulator die pad and a metal die pad, and wherein the metal die pad is embedded within the insulator die pad such that the insulator die pad is exposed at the upper surface and the lower surface of the composite die pad.

9. The package of claim 1, wherein the integrated device die comprises a motion sensor die.

10. The package of claim 1, wherein the metal die pad is patterned with one or more holes and the one or more holes are filled with a molding material.

11. The package of claim 6, wherein the package substrate comprises a composite die pad having an upper surface and a lower surface spaced from the upper surface along a vertical direction, the composite die pad comprising the insulator die pad and a metal die pad, wherein the insulator die pad is disposed above and on top of the metal die pad such that the insulator die pad is exposed at the upper surface of the composite die pad and the metal die pad is exposed at the lower surface of the composite die pad.

12. The package of claim 6, wherein the
    package substrate comprises a molded leadframe in which a metal leadframe is at least partially embedded in a molding material.

13. The package of claim 6, wherein the package lid is electrically grounded to form a radio frequency (RF) shield.

14. The package of claim 6, wherein a top surface of the annular metal ring defines a portion of an upper surface of the package substrate and a bottom surface of the annular metal ring defines a portion of a lower surface of the package substrate.

15. The package of claim 14, wherein the package lid is mounted to the top surface of the annular metal ring.

16. The package of claim 6, wherein the annular metal ring is disposed about a peripheral portion of the package substrate.

17. The package of claim 6, wherein the annular metal ring is disposed between the leads and the insulator die pad.

18. A method of manufacturing an integrated device package, the method comprising:
    providing a package substrate comprising:
        an insulator die pad comprising an insulating material; and
        a plurality of leads disposed about at least a portion of a perimeter of the insulator die pad;
    providing an annular metal ring disposed about the insulator die pad such that the insulator die pad is within the annular metal ring;
    mounting an integrated device die over the insulator die pad; and
    mounting a package lid to the package substrate to define a cavity such that the integrated device die is disposed within the cavity.

19. The method of claim 18, wherein providing the package substrate comprises providing a composite die pad having an upper surface and a lower surface spaced from the upper surface along a vertical direction, the composite die pad comprising the insulator die pad and a metal die pad, the insulator die pad and the metal die pad being disposed adjacent one another along the vertical direction.

20. The method of claim 19, wherein the insulator die pad is disposed above the metal die pad such that the insulator die pad is exposed at the upper surface of the composite die pad and the metal die pad is exposed at the lower surface of the composite die pad.

\* \* \* \* \*